United States Patent
Ashida et al.

(10) Patent No.: US 10,084,225 B2
(45) Date of Patent: Sep. 25, 2018

(54) DIRECTIONAL COUPLER

(71) Applicant: TDK CORPORATION, Tokyo (JP)

(72) Inventors: Yuta Ashida, Tokyo (JP); Noriaki Ootsuka, Tokyo (JP); Takeshi Kijima, Tokyo (JP); Yasunori Sakisaka, Tokyo (JP); Tetsuzo Goto, Tokyo (JP)

(73) Assignee: TDK CORPORATION, Tokyo (JP)

( * ) Notice: Subject to any disclaimer, the term of this patent is extended or adjusted under 35 U.S.C. 154(b) by 3 days.

(21) Appl. No.: 15/367,578

(22) Filed: Dec. 2, 2016

(65) Prior Publication Data
US 2017/0214109 A1    Jul. 27, 2017

(30) Foreign Application Priority Data
Jan. 26, 2016  (JP) .................... 2016-012041

(51) Int. Cl.
*H01P 5/18*    (2006.01)
*H03H 7/18*    (2006.01)

(52) U.S. Cl.
CPC ............... *H01P 5/18* (2013.01); *H01P 5/187* (2013.01); *H03H 7/185* (2013.01)

(58) Field of Classification Search
CPC .................................. H01P 5/18; H03H 7/185
USPC ............................................... 333/109–112
See application file for complete search history.

(56) References Cited

U.S. PATENT DOCUMENTS

| 7,042,309 | B2 * | 5/2006 | Podell | H01P 5/187 333/112 |
| 7,978,021 | B2 * | 7/2011 | Tamaru | H03H 7/42 333/246 |
| 9,077,061 | B2 * | 7/2015 | Tamaru | H01P 5/184 |
| 9,385,411 | B2 * | 7/2016 | Ohashi | H01P 5/187 |
| 9,391,354 | B2 * | 7/2016 | Ootsuka | H01P 5/185 |
| 9,502,746 | B2 * | 11/2016 | Fasenfest | H01P 5/185 |
| 9,653,771 | B2 * | 5/2017 | Ootsuka | H01P 5/184 |
| 2012/0319797 | A1 | 12/2012 | Tamaru | |
| 2015/0236666 | A1 | 8/2015 | Ootsuka et al. | |
| 2017/0033428 | A1 * | 2/2017 | Ootsuka | H01P 5/18 |
| 2017/0040661 | A1 * | 2/2017 | Ashida | H01P 5/18 |

FOREIGN PATENT DOCUMENTS

JP    2013-214840 A    10/2013

OTHER PUBLICATIONS

Arthur B. Williams, "Electronic Filter Design Handbook", McGraw-Hill, 1981, pp. 7-1 to 7-9, New York, USA.

\* cited by examiner

*Primary Examiner* — Dean Takaoka
(74) *Attorney, Agent, or Firm* — Oliff PLC

(57) ABSTRACT

A directional coupler includes a first to a fourth port, a main line connecting the first port and the second port, a first and a second subline section configured to be electromagnetically coupled to the main line, and a phase shifter. The first subline section, the phase shifter, and the second subline section are arranged in this order in series between the third port and the fourth port. The phase shifter outputs a signal that is phase-delayed relative to an input signal. The phase delay amount of the output signal of the phase shifter relative to the input signal increases with increasing frequency of the input signal. A frequency twice as high as the frequency of the input signal at which the phase delay amount is 90 degrees is lower than the frequency of the input signal at which the phase delay amount is 180 degrees.

11 Claims, 19 Drawing Sheets

DIRECTIONAL COUPLER

BACKGROUND OF THE INVENTION

1. Field of the Invention

The present invention relates to a wideband capable directional coupler.

2. Description of the Related Art

Directional couplers are used for detecting the levels of transmission/reception signals in transmission/reception circuits of wireless communication apparatuses such as cellular phones and wireless LAN communication apparatuses.

A directional coupler configured as follows is known as a conventional directional coupler. The directional coupler has an input port, an output port, a coupling port, a terminal port, a main line, and a subline. One end of the main line is connected to the input port, and the other end of the main line is connected to the output port. One end of the subline is connected to the coupling port, and the other end of the subline is connected to the terminal port. The main line and the subline are configured to be electromagnetically coupled to each other. The terminal port is grounded via a terminator having a resistance of 50Ω, for example. The input port receives a high frequency signal, and the output port outputs the same. The coupling port outputs a coupling signal having a power that depends on the power of the high frequency signal received at the input port.

Major parameters indicating the characteristics of directional couplers include coupling, isolation, and return loss at the coupling port. Definitions of these parameters will now be described. First, assume that the input port receives a high frequency signal of power P1. In this case, let P3 denote the power of the signal output from the coupling port. Further, assuming that the output port receives a high frequency signal of power P02, let P03 denote the power of the signal output from the coupling port. Assuming that the coupling port receives a high frequency signal of power P5, let P6 denote the power of the signal reflected at the coupling port. Further, let C denote coupling, I denote isolation, and RL denote return loss at the coupling port. These parameters are defined by the following equations.

$$C = 10 \log(P3/P1) [\text{dB}]$$

$$I = 10 \log(P03/P02) [\text{dB}]$$

$$RL = 10 \log(P6/P5) [\text{dB}]$$

The coupling of the conventional directional coupler increases with increasing frequency of the high frequency signal received at the input port. The conventional directional coupler thus suffers from the problem that the frequency response of the coupling is not flat. Where coupling is denoted as -c (dB), an increase in coupling means a decrease in the value of c.

U.S. Patent Application Publication Nos. 2012/0319797 A1 and 2015/0236666 A1, and JP 2013-214840A each disclose a directional coupler aiming to resolve the aforementioned problem. The directional coupler disclosed in U.S. Patent Application Publication No. 2012/0319797 A1 includes a main line, first and second sublines electromagnetically coupled to the main line, and a phase conversion unit provided between the first and second sublines. The phase conversion unit causes a phase shift to be generated in a signal passing therethrough in such a manner that the absolute value of the phase shift monotonically increases within the range from 0 degree to 180 degrees as the frequency increases in a predetermined frequency band. The phase conversion unit is specifically a low-pass filter.

The directional coupler disclosed in JP 2013-214840A includes a main line and a subline. The subline includes two coupling parts each configured to be electromagnetically coupled to the main line, and a non-coupling part provided between the two coupling parts. The non-coupling part can be said to be a delay line formed of a long line.

The directional coupler disclosed in U.S. Patent Application Publication No. 2015/0236666 A1 includes a main line, first and second subline sections each configured to be electromagnetically coupled to the main line, and a matching circuit provided between the first and second subline sections.

All-pass circuits composed of LC circuits are disclosed in "Electronic Filter Design Handbook" by Arthur B. Williams, McGraw-Hill, New York, 1981, pages 7-1 to 7-9.

Mobile communication systems conforming to the Long Term Evolution (LTE) standard have become practically used in recent years, and further, practical use of mobile communication systems conforming to the LTE-Advanced standard, which is an evolution of the LTE standard, is under study. Carrier Aggregation (CA) is one of the key technologies of the LTE-Advanced standard. CA uses multiple carriers called component carriers simultaneously to enable wideband transmission.

A mobile communication apparatus operable under CA uses multiple frequency bands simultaneously. Accordingly, such a mobile communication apparatus requires a wideband capable directional coupler, that is, a directional coupler usable for multiple signals in multiple frequency bands.

A sought-after characteristic of wideband capable directional couplers is that a change in coupling in response to a change in frequency be reduced over a wide frequency band. In this respect, a satisfactory characteristic has not necessarily been obtained with the directional couplers disclosed in U.S. Patent Application Publication Nos. 2012/0319797 A1 and 2015/0236666 A1, and JP 2013-214840A.

SUMMARY OF THE INVENTION

It is an object of the present invention to provide a directional coupler that achieves a reduced change in coupling in response to a change in frequency over a wide frequency band.

A directional coupler of each of a first and a second aspect of the present invention includes: a first port; a second port; a third port; a fourth port; a main line connecting the first port and the second port; a first subline section and a second subline section each formed of a line configured to be electromagnetically coupled to the main line; and a phase shifter for outputting a signal that is phase-delayed relative to an input signal. The first subline section, the phase shifter, and the second subline section are arranged in this order in series between the third port and the fourth port in terms of circuit configuration.

In the directional coupler of the first aspect of the present invention, a phase delay amount of the output signal of the phase shifter relative to the input signal of the phase shifter increases with increasing frequency of the input signal. A frequency twice as high as a frequency of the input signal at which the phase delay amount is 90 degrees is lower than a frequency of the input signal at which the phase delay amount is 180 degrees.

In the directional coupler of the second aspect of the present invention, the phase shifter includes a first path and a second path. The first path connects the first subline section and the second subline section. The first path includes a first inductance element and a second inductance element having their respective inductances and configured to be inductively coupled to each other. Each of the first and second inductance elements has a first end and a second end opposite to each other. The first end of the first inductance element is connected to the first subline section. The first end of the second inductance element is connected to the second subline section. The second end of the first inductance element and the second end of the second inductance element are connected to each other, and connected to a ground via the second path. The second path includes a first capacitor.

The first inductance element may be a first line. The second inductance element may be a second line. The first line and the second line may be configured to be capacitively coupled to each other.

The first line may include a first line portion. The second line may include a second line portion opposed to the first line portion. The first line portion has a first edge and a second edge opposite to each other, the first edge of the first line portion being closest to the first subline section in terms of circuit configuration. The second line portion has a first edge and a second edge opposite to each other, the first edge of the second line portion being closest to the second subline section in terms of circuit configuration. The first edge of the second line portion is physically closer to the second edge of the first line portion than to any other part of the first line portion. The second edge of the second line portion is physically closer to the first edge of the first line portion than to any other part of the first line portion.

When the phase shifter includes the first and second paths, the phase shifter may further include a third path connecting the first end of the first inductance element and the first end of the second inductance element. The third path includes a second capacitor.

The second path may further include an inductor connected in series to the first capacitor.

The directional coupler of each of the first and second aspects of the present invention may further include a stack for integrating the first to fourth ports, the main line, the first and second subline sections and the phase shifter. The stack includes dielectric layers and conductor layers stacked on each other. The stack may have a top surface and a bottom surface located at opposite ends in the direction in which the dielectric layers and the conductor layers are stacked. The phase shifter may be located closer to the top surface than are the main line and the first and second subline sections.

The directional coupler of each of the first and second aspects of the present invention includes the first and second subline sections and the phase shifter. In the directional coupler of the first aspect of the present invention, the phase delay amount of the output signal of the phase shifter relative to the input signal of the phase shifter increases with increasing frequency of the input signal, and a frequency twice as high as the frequency of the input signal at which the phase delay amount is 90 degrees is lower than the frequency of the input signal at which the phase delay amount is 180 degrees. The phase shifter of the directional coupler of the second aspect of the present invention achieves the above-described characteristics of the phase shifter of the directional coupler of the first aspect of the present invention. By virtue of the foregoing features, the directional couplers of the first and second aspects of the present invention are able to achieve a reduced change in coupling in response to a change in frequency over a wide frequency band.

Other and further objects, features and advantages of the invention will appear more fully from the following description.

DETAILED DESCRIPTION OF THE PREFERRED EMBODIMENTS

[First Embodiment]

Figure 1:
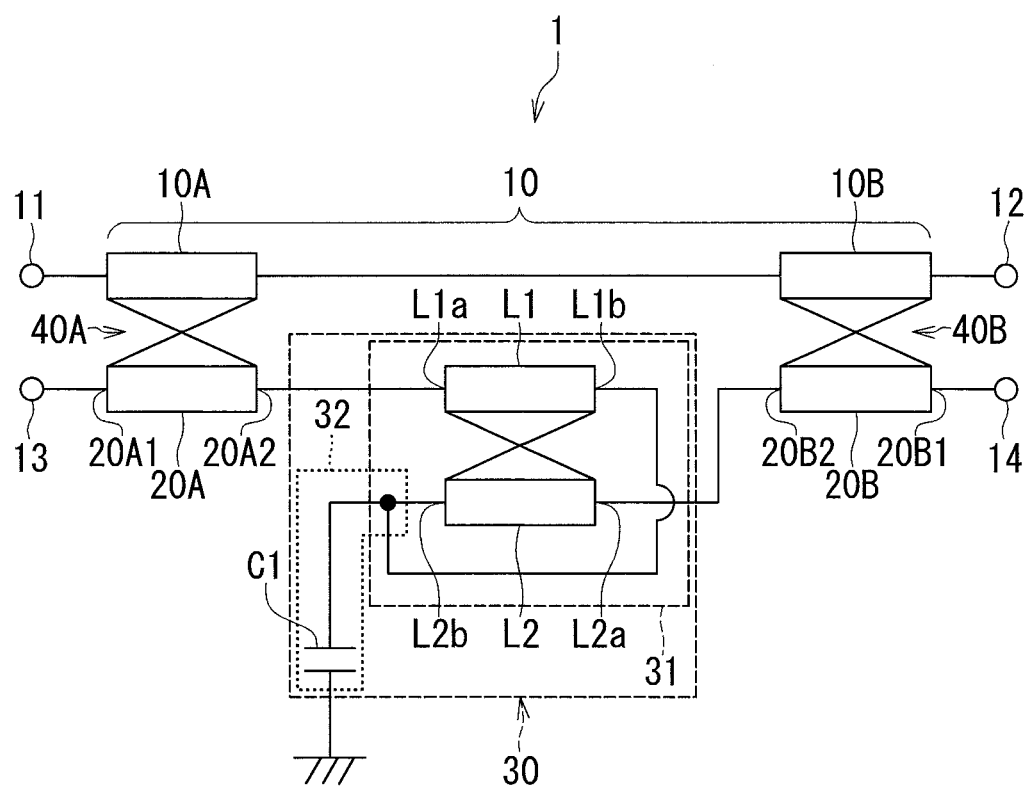
FIG. 1 is a circuit diagram illustrating a first example of the circuit configuration of a directional coupler according to a first embodiment of the invention.
Figure 2:
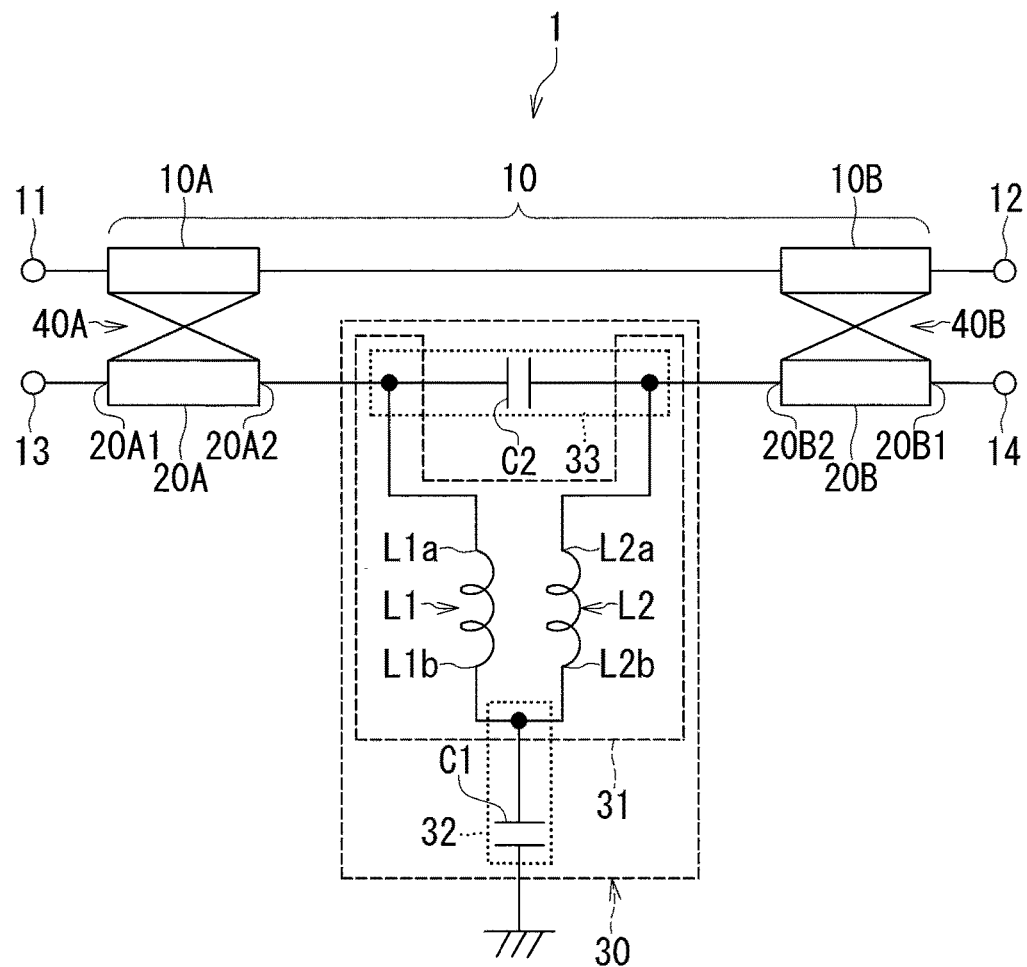
FIG. 2 is a circuit diagram illustrating a second example of the circuit configuration of the directional coupler according to the first embodiment of the invention.

Preferred embodiments of the present invention will now be described in detail with reference to the drawings. First, reference is made to FIG. 1 and FIG. 2 to describe the circuit configuration of a directional coupler according to a first embodiment of the invention. FIG. 1 is a circuit diagram illustrating a first example of the circuit configuration of the directional coupler according to the first embodiment. FIG. 2 is a circuit diagram illustrating a second example of the circuit configuration of the directional coupler according to the first embodiment. As shown in FIG. 1 and FIG. 2, the directional coupler 1 according to the first embodiment includes a first port 11, a second port 12, a third port 13, and a fourth port 14. In the first embodiment, the first port 11 is an input port, the second port 12 is an output port, the third port 13 is a coupling port, and the fourth port 14 is a terminal port. The fourth port 14 is grounded via a terminator having a resistance of, for example, 50Ω.

The directional coupler 1 further includes: a main line 10 connecting the first port 11 and the second port 12; a first subline section 20A and a second subline section 20B each formed of a line configured to be electromagnetically coupled to the main line 10; and a phase shifter 30. The first subline section 20A, the phase shifter 30, and the second subline section 20B are arranged in this order in series between the third port 13 and the fourth port 14 in terms of circuit configuration.

The first subline section 20A has a first end 20A1 and a second end 20A2 opposite to each other. The second subline section 20B has a first end 20B1 and a second end 20B2 opposite to each other. The first end 20A1 of the first subline section 20A is connected to the third port 13. The first end 20B1 of the second subline section 20B is connected to the fourth port 14.

The phase shifter 30 includes a first path 31 and a second path 32. The first path 31 connects the first subline section 20A and the second subline section 20B. The first path 31 includes a first inductance element L1 and a second inductance element L2 having their respective inductances and configured to be inductively coupled to each other. Each of the first and second inductance elements L1 and L2 has a first end and a second end opposite to each other. The first end and the second end of the first inductance element L1 will be denoted by L1a and L1b, respectively. The first end and the second end of the second inductance element L2 will be denoted by L2a and L2b, respectively.

The first end L1a of the first inductance element L1 is connected to the second end 20A2 of the first subline section 20A. The first end L2a of the second inductance element L2 is connected to the second end 20B2 of the second subline section 20B. The second end L1b of the first inductance element L1 and the second end L2b of the second inductance element L2 are connected to each other, and connected to the ground via the second path 32. As shown in FIG. 1 and FIG. 2, the second path 32 includes a first capacitor C1.

The configuration of the first inductance element L1 and the second inductance element L2 will now be described in detail. Each of the first and second inductance elements L1 and L2 may be a line or an inductor which is a lumped constant element. The first example shown in FIG. 1 is an example in which each of the first and second inductance elements L1 and L2 is a line. The second example shown in FIG. 2 is an example in which each of the first and second inductance elements L1 and L2 is an inductor.

In the first example, the first inductance element L1 is taken as a first line, and the second inductance element L2 is taken as a second line. The first line and the second line are configured to be at least inductively coupled to each other. The first line and the second line may be further configured to be capacitively coupled to each other such that the capacitance between the first line and the second line is distributed continuously along the first and second lines, like a distributed constant circuit.

In the first example, the first line may include a first line portion, and the second line may include a second line portion opposed to the first line portion. The first line portion has a first edge and a second edge opposite to each other, the first edge of the first line portion being closest to the first subline section 20A in terms of circuit configuration. The second line portion has a first edge and a second edge opposite to each other, the first edge of the second line portion being closest to the second subline section 20B in terms of circuit configuration. The first edge of the second line portion is physically closer to the second edge of the first line portion than to any other part of the first line portion. The second edge of the second line portion is physically closer to the first edge of the first line portion than to any other part of the first line portion. The first and second line portions will be described in detail later.

In the second example, as shown in FIG. 2, the first inductance element L1 and the second inductance element L2 may be configured to be capacitively coupled to each other via a capacitor which is a lumped constant element. More specifically, the phase shifter 30 shown in FIG. 2 further includes a third path 33 connecting the first end L1a of the first inductance element L1 and the first end L2a of the second inductance element L2. The third path 33 includes a second capacitor C2 for establishing capacitive coupling between the first inductance element L1 and the second inductance element L2.

The main line 10 includes a first portion 10A configured to be electromagnetically coupled to the first subline section 20A, and a second portion 10B configured to be electromagnetically coupled to the second subline section 20B. Here, a combination of the first portion 10A and the first subline section 20A will be referred to as the first coupling section 40A, and a combination of the second portion 10B and the second subline section 20B will be referred to as the second coupling section 40B. The operation of the directional coupler 1 according to the first embodiment will now be described. A high frequency signal is received at the first port 11 and output from the second port 12. The third port 13 outputs a coupling signal having a power that depends on the power of the high frequency signal received at the first port 11.

A first signal path and a second signal path are formed between the first port 11 and the third port 13. The first signal path runs through the first coupling section 40A. The second signal path runs through the second coupling section 40B and the phase shifter 30. When a high frequency signal has been received at the first port 11, the coupling signal to be output from the third port 13 is a signal resulting from a combination of respective signals having passed through the first and second signal paths. The coupling of the directional coupler 1 depends on the coupling of each of the first and second coupling sections 40A and 40B alone and the relationship between the phases of the respective signals having passed through the first and second signal paths.

A third signal path and a fourth signal path are formed between the second port 12 and the third port 13. The third signal path runs through the first coupling section 40A. The fourth signal path runs through the second coupling section 40B and the phase shifter 30. The isolation of the directional coupler 1 depends on the coupling of each of the first and second coupling sections 40A and 40B alone and the relationship between the phases of respective signals having passed through the third and fourth signal paths.

The phase shifter 30 of the first embodiment outputs a signal that is phase-delayed relative to an input signal. The phase delay amount of the output signal of the phase shifter 30 relative to the input signal of the phase shifter 30 increases with increasing frequency of the input signal. A frequency twice as high as the frequency of the input signal at which the phase delay amount is 90 degrees is lower than the frequency of the input signal at which the phase delay amount is 180 degrees. The characteristic of the phase shifter 30 will be described in more detail later.

Figure 3:
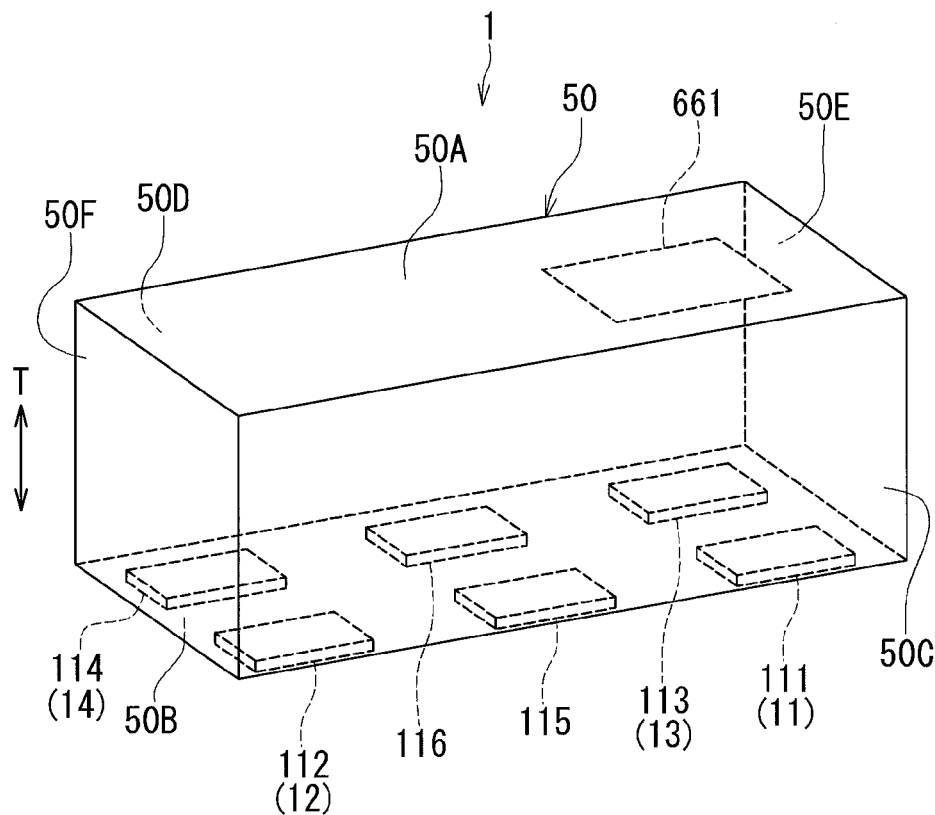
FIG. 3 is a perspective view of the directional coupler according to the first embodiment of the invention.

An example of the structure of the directional coupler 1 will now be described. The example to be described here corresponds to the first example of the circuit configuration shown in FIG. 1. FIG. 3 is a perspective view of the directional coupler 1. The directional coupler 1 shown in FIG. 3 includes a stack 50 for integrating the first to fourth ports 11 to 14, the main line 10, the first and second subline sections 20A and 20B and the phase shifter 30. As will be described in detail later, the stack 50 includes dielectric layers and conductor layers stacked on each other.

The stack 50 is shaped like a rectangular solid and has a periphery. The periphery of the stack 50 includes a top surface 50A, a bottom surface 50B, and four side surfaces 50C, 50D, 50E and 50F. The top surface 50A and the bottom surface 50B are opposite each other. The side surfaces 50C and 50D are opposite each other. The side surfaces 50E and 50F are opposite each other. The side surfaces 50C to 50F are perpendicular to the top surface 50A and the bottom surface 50B. In the stack 50, the dielectric layers and conductor layers are stacked in the direction perpendicular to the top surface 50A and the bottom surface 50B. This direction will be referred to as the stacking direction. The stacking direction is shown by the arrow T in FIG. 3. The top surface 50A and the bottom surface 50B are located at opposite ends in the stacking direction T.

The directional coupler 1 shown in FIG. 3 has a first terminal 111, a second terminal 112, a third terminal 113, a fourth terminal 114, and two ground terminals 115 and 116. The first to fourth terminals 111, 112, 113 and 114 correspond to the first to fourth ports 11, 12, 13 and 14 shown in FIG. 1, respectively. The ground terminals 115 and 116 are connected to the ground. The terminals 111 to 116 are provided on the bottom surface 50B of the stack 50.

Figure 4:
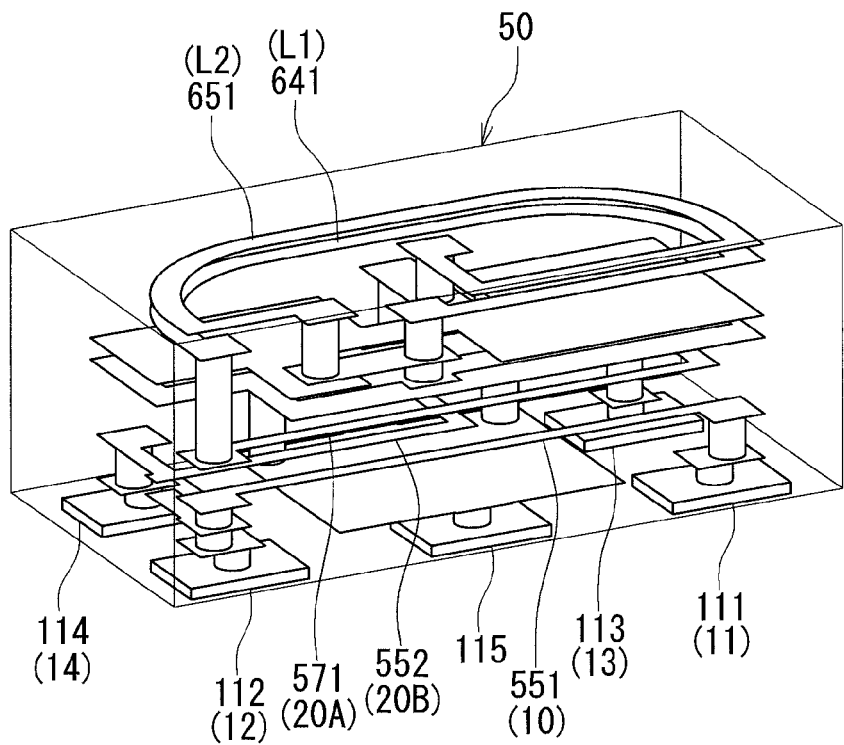
FIG. 4 is a perspective internal view of a stack included in the directional coupler shown in FIG. 3.
Figure 5:
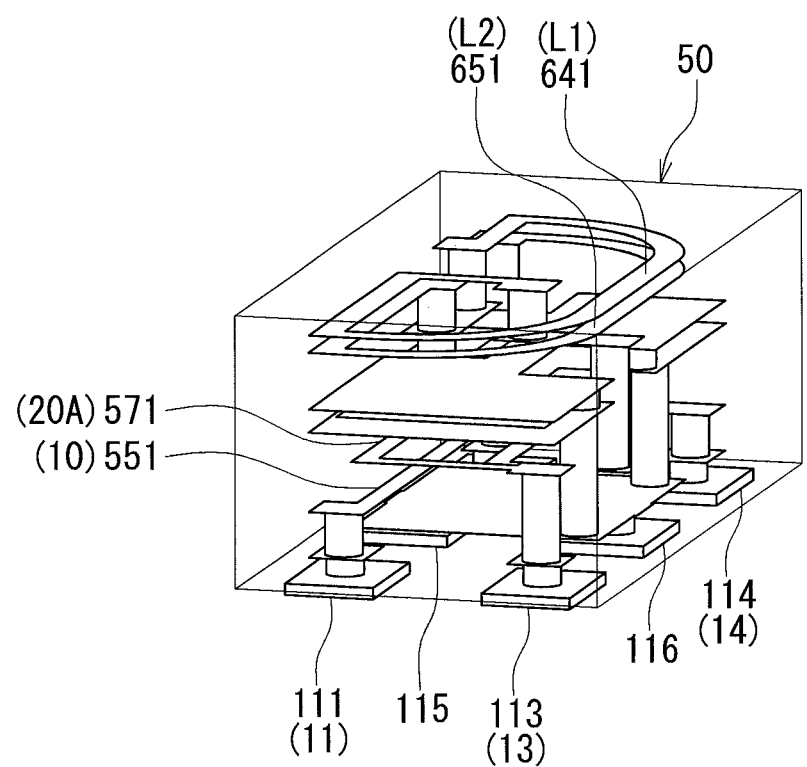
FIG. 5 is a perspective internal view of the stack included in the directional coupler shown in FIG. 3.

The stack 50 will now be described in detail with reference to FIG. 4 to FIG. 9D. The stack 50 includes sixteen dielectric layers stacked on top of one another. The sixteen dielectric layers will be referred to as the first to sixteenth dielectric layers in the order from bottom to top. FIG. 4 and FIG. 5 are perspective internal views of the stack 50. FIG. 6A to FIG. 6D illustrate the respective patterned surfaces of the first to fourth dielectric layers. FIG. 7A to FIG. 7D illustrate the respective patterned surfaces of the fifth to eighth dielectric layers. FIG. 8A to FIG. 8D illustrate the respective patterned surfaces of the ninth to twelfth dielectric layers. FIG. 9A to FIG. 9D illustrate the respective patterned surfaces of the thirteenth to sixteenth dielectric layers.

Figure 6A:
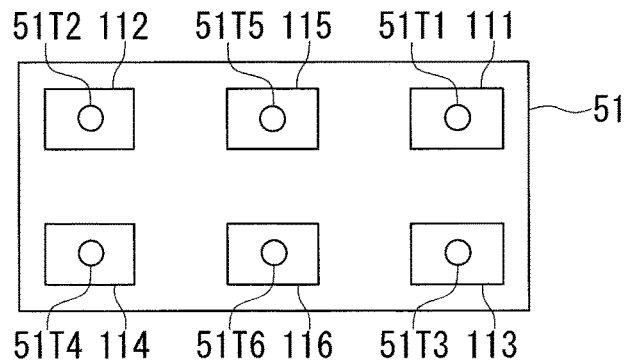
FIG. 6A to FIG. 6D are explanatory diagrams illustrating the respective patterned surfaces of first to fourth dielectric layers of the stack included in the directional coupler shown in FIG. 3.

As shown in FIG. 6A, the first to fourth terminals 111, 112, 113 and 114 and the ground terminals 115 and 116 are formed on the patterned surface of the first dielectric layer 51. Further, through holes 51T1, 51T2, 51T3, 51T4, 51T5 and 51T6 are formed in the dielectric layer 51. The through holes 51T1, 51T2, 51T3, 51T4, 51T5 and 51T6 are connected to the terminals 111, 112, 113, 114, 115 and 116, respectively.

Figure 6B:
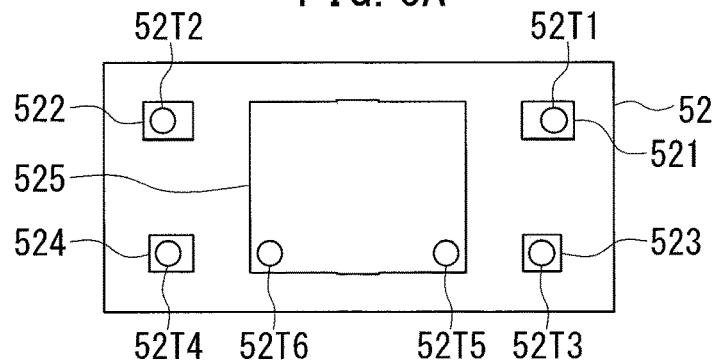

As shown in FIG. 6B, conductor layers 521, 522, 523 and 524, and a ground conductor layer 525 are formed on the patterned surface of the second dielectric layer 52. Further, through holes 52T1, 52T2, 52T3, 52T4, 52T5 and 52T6 are formed in the dielectric layer 52. The through hole 51T1 shown in FIG. 6A and the through hole 52T1 are connected to the conductor layer 521. The through hole 51T2 shown in FIG. 6A and the through hole 52T2 are connected to the conductor layer 522. The through hole 51T3 shown in FIG. 6A and the through hole 52T3 are connected to the conductor layer 523. The through hole 51T4 shown in FIG. 6A and the through hole 52T4 are connected to the conductor layer 524. The through holes 51T5 and 51T6 shown in FIG. 6A and the through holes 52T5 and 52T6 are connected to the ground conductor layer 525.

Figure 6C:
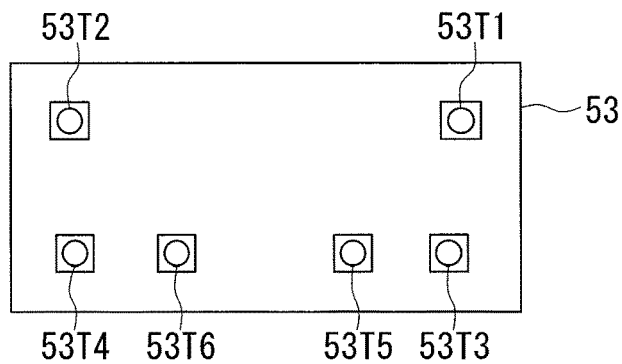

As shown in FIG. 6C, through holes 53T1, 53T2, 53T3, 53T4, 53T5 and 53T6 are formed in the third dielectric layer 53. The through holes 52T1 to 52T6 shown in FIG. 6B are connected to the through holes 53T1 to 53T6, respectively.

Figure 6D:
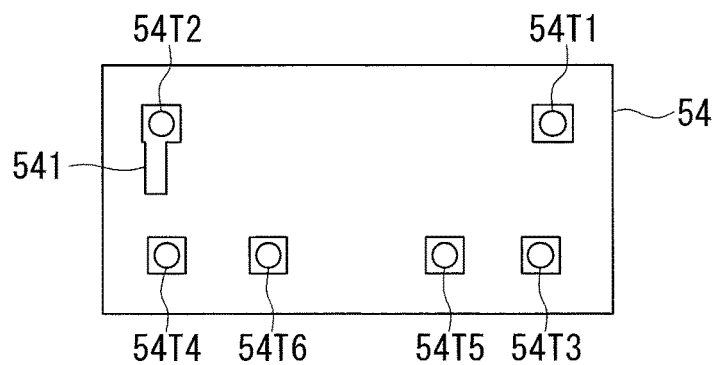

As shown in FIG. 6D, a conductor layer 541 is formed on the patterned surface of the fourth dielectric layer 54. Further, through holes 54T1, 54T2, 54T3, 54T4, 54T5 and 54T6 are formed in the dielectric layer 54. The through holes 53T1 and 53T3 to 53T6 shown in FIG. 6C are connected to the through holes 54T1 and 54T3 to 54T6, respectively. The through hole 54T2 is connected to the conductor layer 541 and to the through hole 53T2 shown in FIG. 6C.

Figure 7A:
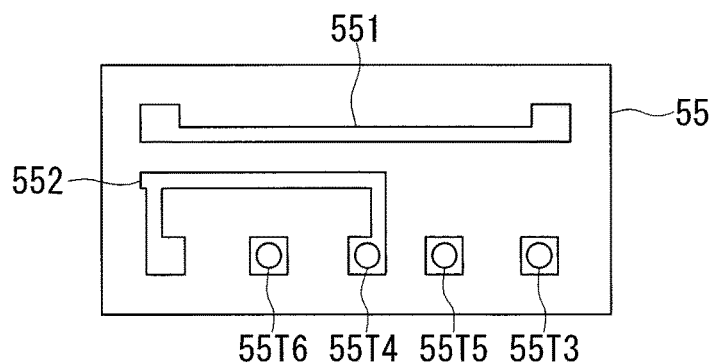
FIG. 7A to FIG. 7D are explanatory diagrams illustrating the respective patterned surfaces of fifth to eighth dielectric layers of the stack included in the directional coupler shown in FIG. 3.

As shown in FIG. 7A, conductor layers 551 and 552 are formed on the patterned surface of the fifth dielectric layer 55. The conductor layers 551 and 552 are used to form the main line 10 and the second subline section 20B, respectively. Each of the conductor layers 551 and 552 has a first end and a second end. Further, through holes 55T3, 55T4, 55T5 and 55T6 are formed in the dielectric layer 55. The through holes 54T3, 54T5 and 54T6 shown in FIG. 6D are connected to the through holes 55T3, 55T5 and 55T6, respectively. The through hole 55T4 is connected to a portion of the conductor layer 552 near the first end thereof. The through hole 54T1 shown in FIG. 6D is connected to a portion of the conductor layer 551 near the first end thereof. The through hole 54T2 shown in FIG. 6D is connected to a portion of the conductor layer 551 near the second end thereof. The through hole 54T4 shown in FIG. 6D is connected to a portion of the conductor layer 552 near the second end thereof.

Figure 7B:
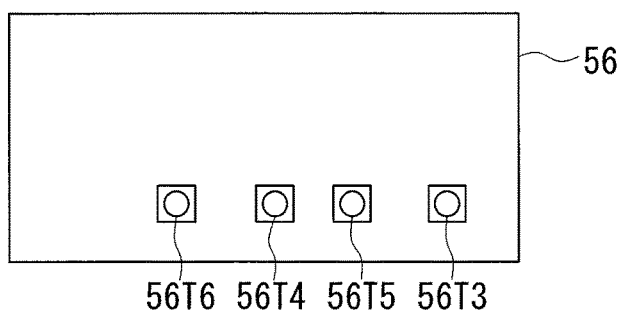

As shown in FIG. 7B, through holes 56T3, 56T4, 56T5 and 56T6 are formed in the sixth dielectric layer 56. The through holes 55T3 to 55T6 shown in FIG. 7A are connected to the through holes 56T3 to 56T6, respectively.

Figure 7C:
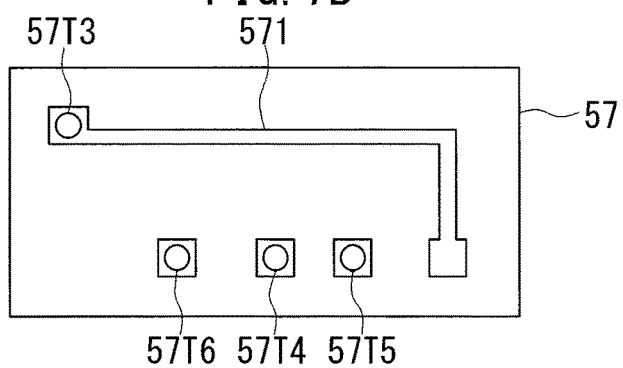

As shown in FIG. 7C, a conductor layer 571 is formed on the patterned surface of the seventh dielectric layer 57. The conductor layer 571 is used to form the first subline section 20A, and has a first end and a second end. Further, through holes 57T3, 57T4, 57T5 and 57T6 are formed in the dielectric layer 57. The through hole 57T3 is connected to a portion of the conductor layer 571 near the first end thereof. The through holes 56T4, 56T5 and 56T6 shown in FIG. 7B are connected to the through holes 57T4, 57T5 and 57T6, respectively. The through hole 56T3 shown in FIG. 7B is connected to a portion of the conductor layer 571 near the second end thereof.

Figure 7D:
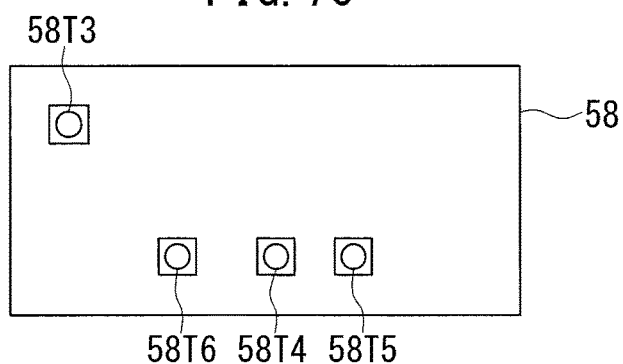

As shown in FIG. 7D, through holes 58T3, 58T4, 58T5 and 58T6 are formed in the eighth dielectric layer 58. The through holes 57T3 to 57T6 shown in FIG. 7C are connected to the through holes 58T3 to 58T6, respectively.

Figure 8A:
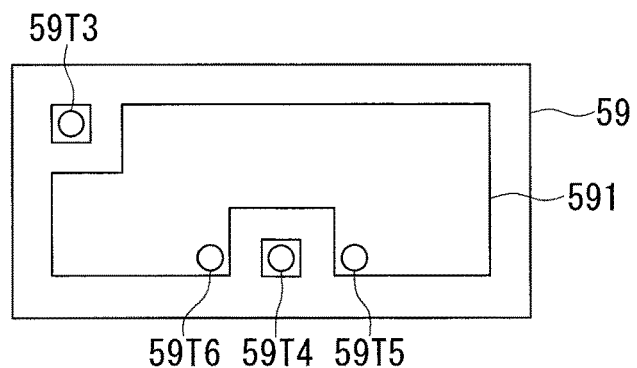
FIG. 8A to FIG. 8D are explanatory diagrams illustrating the respective patterned surfaces of ninth to twelfth dielectric layers of the stack included in the directional coupler shown in FIG. 3.

As shown in FIG. 8A, a ground conductor layer 591 is formed on the patterned surface of the ninth dielectric layer 59. Further, through holes 59T3, 59T4, 59T5 and 59T6 are formed in the dielectric layer 59. The through holes 58T3 and 58T4 shown in FIG. 7D are connected to the through holes 59T3 and 59T4, respectively. The through holes 58T5 and 58T6 shown in FIG. 7D and the through holes 59T5 and 59T6 are connected to the ground conductor layer 591.

Figure 8B:
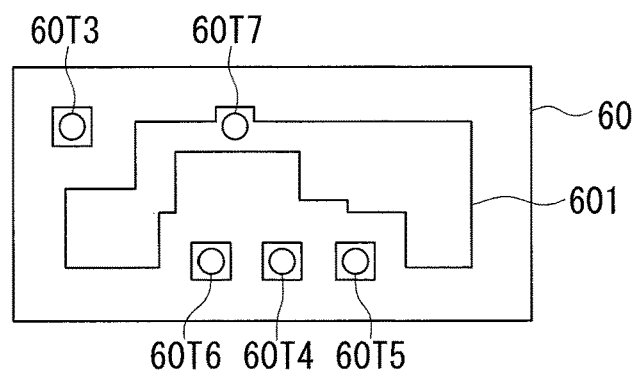

As shown in FIG. 8B, a conductor layer 601 is formed on the patterned surface of the tenth dielectric layer 60. The conductor layer 601 is used to form the first capacitor C1. Further, through holes 60T3, 60T4, 60T5, 60T6 and 60T7 are formed in the dielectric layer 60. The through holes 59T3 to 59T6 shown in FIG. 8A are connected to the through holes 60T3 to 60T6, respectively. The through hole 60T7 is connected to the conductor layer 601.

Figure 8C:
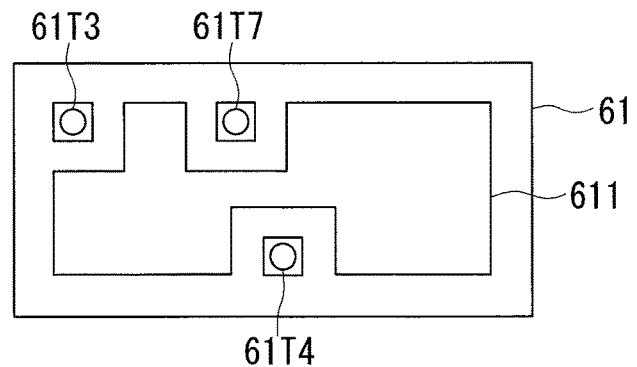

As shown in FIG. 8C, a ground conductor layer 611 is formed on the patterned surface of the eleventh dielectric layer 61. Further, through holes 61T3, 61T4 and 61T7 are formed in the dielectric layer 61. The through holes 60T3, 60T4 and 60T7 shown in FIG. 8B are connected to the through holes 61T3, 61T4 and 61T7, respectively. The through holes 60T5 and 60T6 shown in FIG. 8B are connected to the ground conductor layer 611.

Figure 8D:
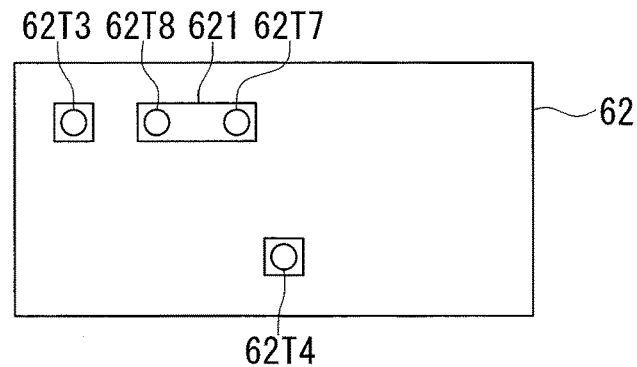

As shown in FIG. 8D, a conductor layer 621 is formed on the patterned surface of the twelfth dielectric layer 62. Further, through holes 62T3, 62T4, 62T7 and 62T8 are formed in the dielectric layer 62. The through holes 61T3 and 61T4 shown in FIG. 8C are connected to the through holes 62T3 and 62T4, respectively. The through hole 61T7 shown in FIG. 8C and the through holes 62T7 and 62T8 are connected to the conductor layer 611.

Figure 9A:
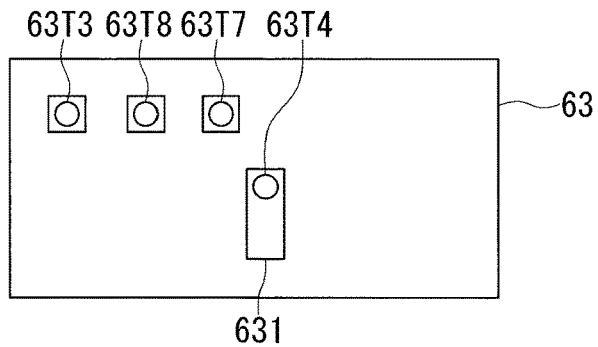
FIG. 9A to FIG. 9D are explanatory diagrams illustrating the respective patterned surfaces of thirteenth to sixteenth dielectric layers of the stack included in the directional coupler shown in FIG. 3.

As shown in FIG. 9A, a conductor layer 631 is formed on the patterned surface of the thirteenth dielectric layer 63. Further, through holes 63T3, 63T4, 63T7 and 63T8 are formed in the dielectric layer 63. The through holes 62T3, 62T7 and 62T8 shown in FIG. 8D are connected to the through holes 63T3, 63T7 and 63T8, respectively. The through hole 62T4 shown in FIG. 8D and the through hole 63T4 are connected to the conductor layer 621.

Figure 9B:
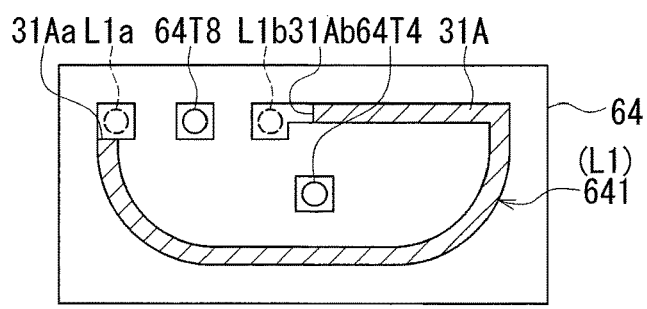

As shown in FIG. 9B, a conductor layer 641 is formed on the patterned surface of the fourteenth dielectric layer 64. The conductor layer 641 is used to form the first inductance element L1, and has a first end and a second end. Further, through holes 64T4 and 64T8 are formed in the dielectric layer 64. The through holes 63T4 and 63T8 shown in FIG. 9A are connected to the through holes 64T4 and 64T8, respectively. The through hole 63T3 shown in FIG. 9A is connected to a portion of the conductor layer 641 near the first end thereof. The through hole 63T7 shown in FIG. 9A is connected to a portion of the conductor layer 641 near the second end thereof.

Figure 9C:
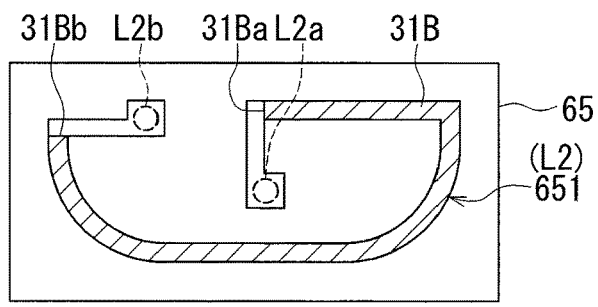

As shown in FIG. 9C, a conductor layer 651 is formed on the patterned surface of the fifteenth dielectric layer 65. The conductor layer 651 is used to form the second inductance element L2, and has a first end and a second end. The through hole 64T4 shown in FIG. 9B is connected to a portion of the conductor layer 651 near the first end thereof. The through hole 64T8 shown in FIG. 9B is connected to a portion of the conductor layer 651 near the second end thereof.

Figure 9D:
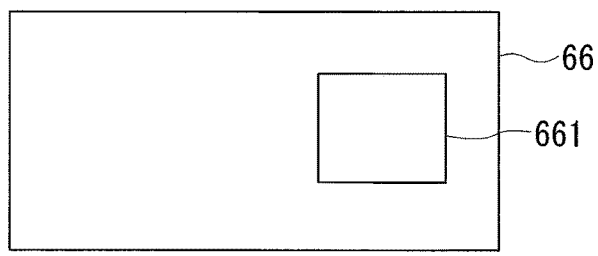

As shown in FIG. 9D, a mark 661 is formed on the patterned surface of the sixteenth dielectric layer 66.

The stack 50 shown in FIG. 3 is formed by stacking the first to sixteenth dielectric layers 51 to 66 such that the patterned surface of the first dielectric layer 51 also serves as the bottom surface 50B of the stack 50.

FIG. 4 shows the interior of the stack 50 as viewed from the side surface 50C. FIG. 5 shows the interior of the stack 50 as viewed from the side surface 50E.

Correspondences of the circuit components of the first example of the directional coupler 1 shown in FIG. 1 with the components inside the stack 50 shown in FIG. 6A to FIG. 9D will now be described. The main line 10 is formed of the conductor layer 551 shown in FIG. 7A. The portion of the conductor layer 551 near the first end thereof is connected to the first terminal 111 via the through hole 51T1, the conductor layer 521, and the through holes 52T1, 53T1 and 54T1. The portion of the conductor layer 551 near the second end thereof is connected to the second terminal 112 via the through hole 51T2, the conductor layer 522, and the through holes 52T2, 53T2 and 54T2.

Part of the conductor layer 571 shown in FIG. 7C is opposed to part of the conductor layer 551 with the dielectric layers 55 and 56 interposed therebetween. The first subline section 20A is formed of the aforementioned part of the conductor layer 571. The portion of the conductor layer 571 near the second end thereof is connected to the third terminal 113 via the through hole 51T3, the conductor layer 523, and the through holes 52T3, 53T3, 54T3, 55T3 and 56T3.

Part of the conductor layer 552 shown in FIG. 7A is opposed to part of the conductor layer 551. The second subline section 20B is formed of the aforementioned part of the conductor layer 552. The portion of the conductor layer 552 near the second end thereof is connected to the fourth terminal 114 via the through hole 51T4, the conductor layer 524, and the through holes 52T4, 53T4 and 54T4.

The first inductance element L1 is formed of the conductor layer 641 shown in FIG. 9B. The portion of the conductor layer 641 near the first end thereof is connected to the conductor layer 571, which is used to form the first subline section 20A, via the through holes 57T3, 58T3, 59T3, 60T3, 61T3, 62T3 and 63T3. The junction between the conductor layer 641 and the through hole 63T3 corresponds to the first end L1a of the first inductance element L1. The junction between the conductor layer 641 and the through hole 63T7 corresponds to the second end L1b of the first inductance element L1.

The second inductance element L2 is formed of the conductor layer 651 shown in FIG. 9C. The portion of the conductor layer 651 near the first end thereof is connected to the conductor layer 552, which is used to form the second subline section 20B, via the through holes 55T4, 56T4, 57T4, 58T4, 59T4, 60T4, 61T4 and 62T4, the conductor layer 631, and the through holes 63T4 and 64T4. The junction between the conductor layer 651 and the through hole 64T4 corresponds to the first end L2a of the second inductance element L2. The junction between the conductor layer 651 and the through hole 64T8 corresponds to the second end L2b of the second inductance element L2.

The first capacitor C1 is formed of the conductor layers 591, 601 and 611 shown in FIG. 8A to FIG. 8C, the dielectric layer 59 interposed between the conductor layers 591 and 601, and the dielectric layer 60 interposed between the conductor layers 601 and 611. The conductor layers 591 and 611 are connected to the ground terminals 115 and 116 via the through holes 51T5 and 51T6, the conductor layer 525, and the through holes 52T5, 52T6, 53T5, 53T6, 54T5, 54T6, 55T5, 55T6, 56T5, 56T6, 57T5, 57T6, 58T5, 58T6, 59T5, 59T6, 60T5 and 60T6. The conductor layer 601 is connected to the conductor layer 621 shown in FIG. 8D via the through holes 60T7 and 61T7. The conductor layer 621 is connected to the conductor layer 641, which is used to form the first inductance element L1, via the through holes 62T7 and 63T7. The conductor layer 621 is connected to the conductor layer 651, which is used to form the second inductance element L2, via the through holes 62T8, 63T8 and 64T8.

The structural features of the directional coupler 1 including the stack 50 will now be described. In the stack 50, the conductor layer 641 used to form the first inductance element L1, the conductor layer 651 used to form the second inductance element L2, and the conductor layers 591, 601, 611 and dielectric layers 59, 60 used to form the first capacitor C1 are located closer to the top surface 50A than are the conductor layer 551 used to form the main line 10, the conductor layer 571 used to form the first subline section 20A, and the conductor layer 552 used to form the second subline section 20B. Thus, the phase shifter 30 is located closer to the top surface 50A than are the main line 10 and the first and second subline sections 20A and 20B.

Further, the conductor layer 641 used to form the first inductance element L1 and the conductor layer 651 used to form the second inductance element L2 are located closer to the top surface 50A than are the conductor layers 591, 601, 611 and dielectric layers 59, 60 used to form the first capacitor C1.

The ground conductor layer 591 is interposed between the conductor layer 551, which is used to form the main line 10, and the conductor layers 641, 651. Thus, neither of the first and second inductance elements L1 and L2 is configured to be electromagnetically coupled to the main line 10.

As previously mentioned, in the first example of the directional coupler 1, the first inductance element L1 and the second inductance element L2 are the first line and the second line, respectively. The first line is formed of the conductor layer 641 shown in FIG. 9B. The second line is formed of the conductor layer 651 shown in FIG. 9C.

The first line includes a first line portion 31A. In FIG. 9B the first line portion 31A is shown with hatching. The first line portion 31A has a first edge 31Aa and a second edge 31Ab opposite to each other, the first edge 31Aa being closest to the first subline section 20A in terms of circuit configuration. The first edge 31Aa is located near the first end L1a of the first inductance element L1. The second edge 31Ab is located near the second end L1b of the first inductance element L1.

The second line includes a second line portion 31B opposed to the first line portion 31A. In FIG. 9C the second line portion 31B is shown with hatching. The second line portion 31B has a first edge 31Ba and a second edge 31Bb opposite to each other, the first edge 31Ba being closest to the second subline section 20B in terms of circuit configuration. The first edge 31Ba is located near the first end L2a of the second inductance element L2. The second edge 31Bb is located near the second end L2b of the second inductance element L2.

As shown in FIG. 9B and FIG. 9C, the first edge 31Ba of the second line portion 31B is physically closer to the second edge 31Ab of the first line portion 31A than to any other part of the first line portion 31A. The second edge 31Bb of the second line portion 31B is physically closer to the first edge 31Aa of the first line portion 31A than to any other part of the first line portion 31A.

Figure 10:
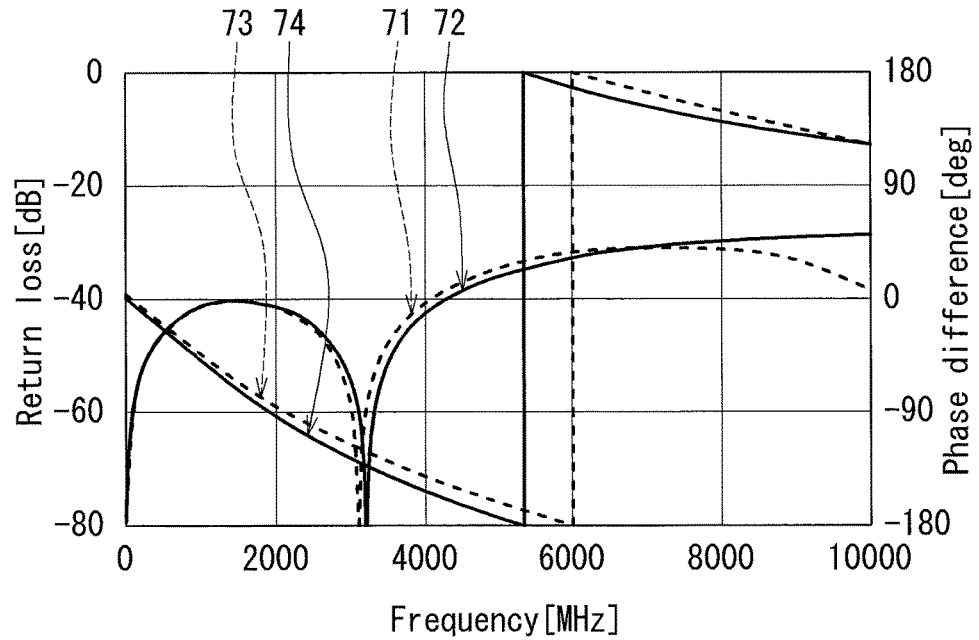
FIG. 10 is a characteristic diagram illustrating the characteristics of phase shifters shown in FIG. 1 and FIG. 2.

Now, the characteristics of the phase shifter 30 of the first embodiment and the effects resulting therefrom will be described. FIG. 10 is a characteristic diagram illustrating the characteristics of the phase shifters 30 shown in FIGS. 1 and 2. The characteristics shown in FIG. 10 were determined by simulation. The simulation assumed that the first line (the first inductance element L1) and the second line (the second inductance element L2) were capacitively coupled to each other such that the capacitance between the first line and the second line was distributed continuously along the first and second lines. The simulation further assumed that the phase shifter 30 shown in FIG. 2 included the third path 33 including the second capacitor C2. Further, in the simulation, the phase shifters 30 shown in FIG. 1 and FIG. 2 were designed so that the return loss of the phase shifter 30 shown in FIG. 1 and the return loss of the phase shifter 30 shown in FIG. 2 had substantially the same frequency responses.

In FIG. 10 the horizontal axis represents frequency, and the vertical axis represents the return loss of the phase shifters 30 and the phase difference between the input signal and the output signal of the phase shifters 30. In FIG. 10 the line 71 represents the frequency response of the return loss of the phase shifter 30 shown in FIG. 1, and the line 72 represents the the frequency response of the return loss of the phase shifter 30 shown in FIG. 2. The line 73 represents the frequency response of the phase difference between the input signal and the output signal of the phase shifter 30 shown in FIG. 1. The line 74 represents the the frequency response of the phase difference between the input signal and the output signal of the phase shifter 30 shown in FIG. 2.

In the following descriptions, the phase delay amount of the output signal of the phase shifter 30 relative to the input signal of the phase shifter 30 will be referred to as the phase delay amount at the phase shifter 30. In FIG. 10, when the phase difference falls within the range of 0 degree to −180 degrees, the phase delay amount at the phase shifter 30 is the absolute value of the phase difference. In FIG. 10, when the phase difference falls within a range that is greater than 0 degree and smaller than or equal to 180 degrees, the phase delay amount at the phase shifter 30 is 360 degrees minus the phase difference.

As can be understood from FIG. 10, the phase delay amount at each of the phase shifters 30 shown in FIG. 1 and FIG. 2 increases with increasing frequency of the input signal.

For the directional coupler 1 according to the first embodiment, the coupling of each of the first and second coupling sections 40A and 40B alone increases with increasing frequency of the input signal at the first port 11 in the service frequency band of the directional coupler 1. On the other hand, the phase delay amount at the phase shifter 30 increases with increasing frequency of the input signal at the first port 11. The closer to 180 degrees is the phase delay amount at the phase shifter 30, the greater is the degree to which a signal having passed through the signal path running through the first coupling section 40A and a signal having passed through the signal path running through the second coupling section 40B and the phase shifter 30 cancel each other out. A change in the coupling of the directional coupler 1 in response to a change in frequency is thus reduced.

As shown in FIG. 10, the frequency response 73 of the phase difference at the phase shifter 30 shown in FIG. 1 and the frequency response 74 of the phase difference at the phase shifter 30 shown in FIG. 2 are both represented by curves convex downward. In this case, for both of the phase shifters 30 shown in FIG. 1 and FIG. 2, a frequency twice as high as the frequency of the input signal at which the phase delay amount is 90 degrees is lower than the frequency of the input signal at which the phase delay amount is 180 degrees. The condition for the phase shifter 30 of the first embodiment that the frequency twice as high as the frequency of the input signal at which the phase delay amount is 90 degrees is lower than the frequency of the input signal at which the phase delay amount is 180 degrees indicates that the frequency response of the phase difference is represented by a curve convex downward.

The significance of the frequency response of the phase difference being represented by a curve convex downward will now be described. As mentioned above, the closer to 180 degrees is the phase delay amount at the phase shifter 30, the greater is the degree to which a signal having passed through the signal path running through the first coupling section 40A and a signal having passed through the signal path running through the second coupling section 40B and the phase shifter 30 cancel each other out. The frequency response of the phase difference being represented by a curve convex downward means that the phase delay amount is closer to 180 degrees throughout a predetermined frequency range including the frequency of the input signal at which the phase delay amount is 180 degrees, when compared with a case where the frequency response of the phase difference is represented by a straight line. Thus, the first embodiment achieves a reduced change in coupling of the directional coupler 1 in response to a change in frequency over a wider frequency band than in the case where the frequency response of the phase difference is represented by a straight line.

As shown in FIG. 10, the frequency response 74 of the phase difference at the phase shifter 30 shown in FIG. 2 has greater convexity downward than the frequency response 73 of the phase difference at the phase shifter 30 shown in FIG. 1. Thus, for the configuration of the phase shifter 30, the second example shown in FIG. 2 is more preferable than the first example shown in FIG. 1.

Figure 11:
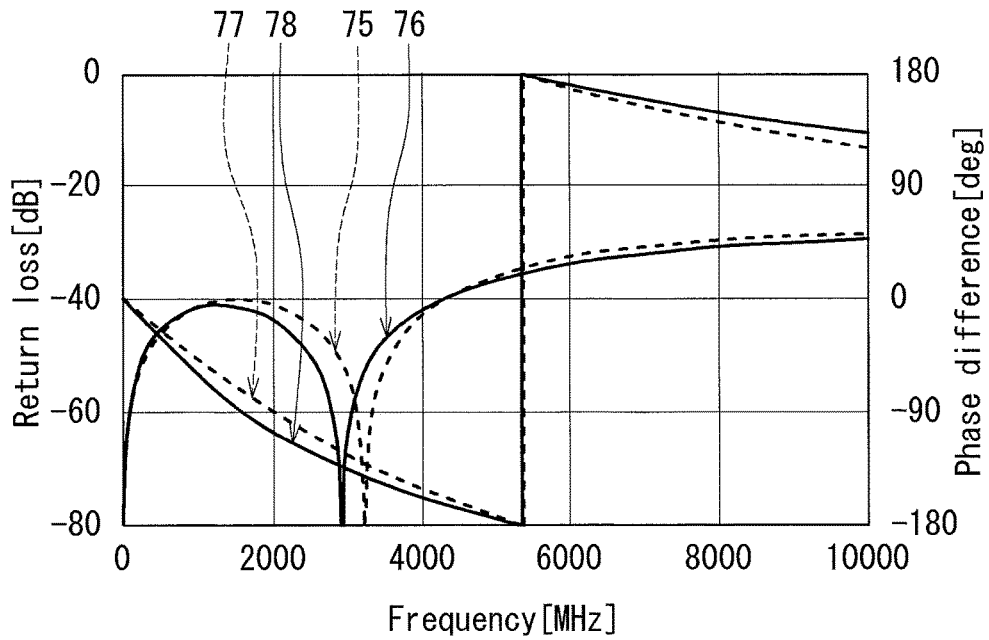
FIG. 11 is a characteristic diagram illustrating changes in the characteristics of the phase shifter with different coupling coefficients of the inductive coupling between the first and second inductance elements.

FIG. 11 is a characteristic diagram illustrating changes in the characteristics of the phase shifter with different coupling coefficients K of the inductive coupling between the first inductance element L1 and the second inductance element L2. The characteristics shown in FIG. 11 were determined by simulation. The simulation assumed that the phase shifter 30 had the configuration of the second example shown in FIG. 2 with the third path 33 including the second capacitor C2.

In FIG. 11, the horizontal axis represents frequency, and the vertical axis represents the return loss of the phase shifter 30 and the phase difference between the input signal and the output signal of the phase shifter 30. In FIG. 11 the line 75 represents the frequency response of the return loss of the phase shifter 30 when the coupling coefficient K is 0.7. The line 76 represents the frequency response of the return loss of the phase shifter 30 when the coupling coefficient K is 0.8. The line 77 represents the frequency response of the phase difference between the input signal and the output signal of the phase shifter 30 when the coupling coefficient K is 0.7. The line 78 represents the frequency response of the phase difference between the input signal and the output signal of the phase shifter 30 when the coupling coefficient K is 0.8.

In FIG. 11, the frequency response 78 of the phase difference when the coupling coefficient K is 0.8 has greater convexity downward than the frequency response 77 of the phase difference when the coupling coefficient K is 0.7. This suggests that the higher the coupling coefficient K, the better.

Reference is now made to "Electronic Filter Design Handbook" mentioned previously to describe the reason why the phase difference provided by the phase shifter 30 of the present embodiment shows a frequency response represented by a curve convex downward. The phase shifter 30 of the present embodiment is a circuit that implements a secondary all-pass transfer function. Let $\beta$ denote the phase difference at the phase shifter 30. In accordance with Equation (7-10) on page 7-3 of "Electronic Filter Design Handbook", the phase difference $\beta$ is expressible by Equation (1) below using the angular frequency $\omega$, the resonant angular frequency wr of the transfer function pole, and the Q of the pole.

$$\beta = -2\tan^{-1}\{\omega\omega r/Q(\omega r^2 - \omega^2)\} \tag{1}$$

The second derivative of $\beta$ with respect to $\omega$ is expressible by Equation (2) below.

$$d^2\beta/d\omega^2 = [4Q(1+2Q)\omega r^5\omega/\{Q^2(\omega^2-\omega r^2)^2+\omega^2\omega r^2\}^2] \cdot [Q^2(\omega^2/\omega r^2-1)^2/(1+2Q)+(1-2Q)] \tag{2}$$

Given that $\omega r$ is greater than zero and Q is greater than or equal to zero, if $1-2Q$ is greater than or equal to zero, i.e., if Q is smaller than or equal to ½, then $d^2\beta/d\omega^2$ expressed by Equation (2) is greater than or equal to zero for a given $\omega$. The value of $d^2\beta/d\omega^2$ being greater than or equal to zero for a given $\omega$ indicates that the frequency response of the phase difference β is represented by a curve convex downward. Thus, for the phase shifter 30 of the present embodiment, a frequency response of the phase difference represented by a curve convex downward is obtained if Q is smaller than or equal to ½.

Now, a description will be given of the coupling coefficient K of the inductive coupling between the first inductance element L1 and the second inductance element L2. In accordance with Equation (7-23) on page 7-7 of "Electronic Filter Design Handbook", the coupling coefficient K is expressible by Equation (3) below.

$$K=(1-Q^2)/(1+Q^2) \quad (3)$$

From Equation (3), the coupling coefficient K is 0.6 or more when Q is ½ or less. For the phase shifter 30 of the present embodiment, it is thus preferred that the coupling coefficient K be 0.6 or more.

For the phase shifter 30 of the present embodiment, both of the first example shown in FIG. 1 and the second example shown in FIG. 2 require that the first and second inductance elements L1 and L2 be inductively coupled to each other with a coupling coefficient K of a positive value. To achieve this, for the first example, the first line and the second line need to be arranged to bring the mutually opposed first and second line portions 31A and 31B into the physical layout described previously.

For the directional coupler 1 according to the present embodiment, assume that the fourth port 14 is grounded via a terminator as a load, and a signal source having an output impedance equal to the resistance of the terminator (e.g., 50Ω) is connected to the third port 13. In this case, the reflection coefficient as viewed from the third port 13 to the fourth port 14 preferably has an absolute value of zero or near zero in the service frequency band of the directional coupler 1. The phase shifter 30 thus preferably has the characteristics of an all-pass filter.

Now, a description will be given of what is required for the phase shifter 30 to have the characteristics of an all-pass filter. For the phase shifter 30 to have the characteristics of an all-pass filter in the second example shown in FIG. 2, it is required that the resonant frequency of a parallel resonant circuit obtained by open-circuiting the capacitor C1 be equal to the resonant frequency of a series resonant circuit obtained by short-circuiting the capacitor C2. Thus, the second example shown in FIG. 2 requires the capacitor C2 in order for the phase shifter 30 to have the characteristics of an all-pass filter.

For the first example shown in FIG. 1, the phase shifter 30 achieves the characteristics of an all-pass filter if one or both of the following conditions are met: (1) the first inductance element L1 and the second inductance element L2 are configured to be capacitively coupled to each other such that the capacitance between the first line and the second line is distributed continuously along the first and second lines; and (2) the first inductance element L1 and the second inductance element L2 are configured to be capacitively coupled to each other via the capacitor C2 which is a lumped constant element, as in the second example.

Figure 12:
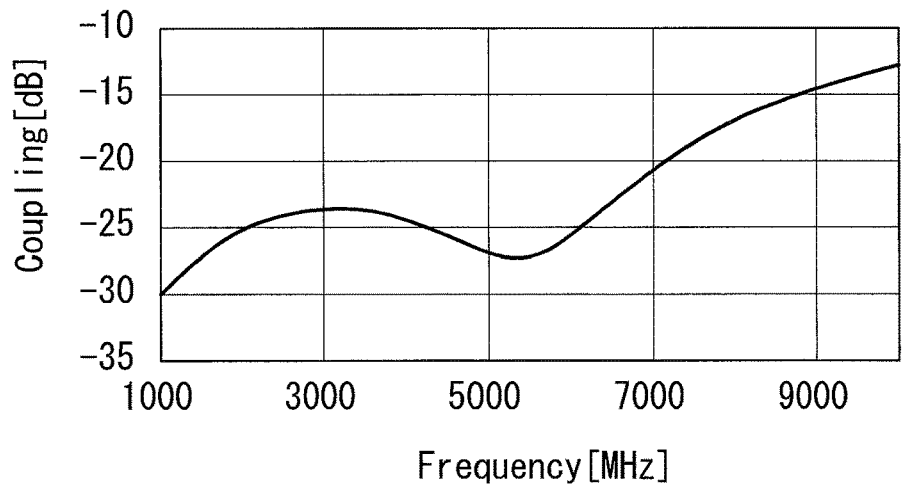
FIG. 12 is a characteristic diagram illustrating the frequency response of the coupling of the directional coupler according to the first embodiment of the invention.

An example of characteristics of the directional coupler 1 according to the present embodiment will now be described with reference to FIG. 12 to FIG. 17. FIG. 12 is a characteristic diagram illustrating the frequency response of the coupling of the directional coupler 1. In FIG. 12 the horizontal axis represents frequency, and the vertical axis represents coupling. If we let −c (dB) denote coupling, the value of c in the example of FIG. 12 is sufficiently large, i.e., 20 or above, in the frequency band of 1000 to 7000 MHz.

Figure 13:
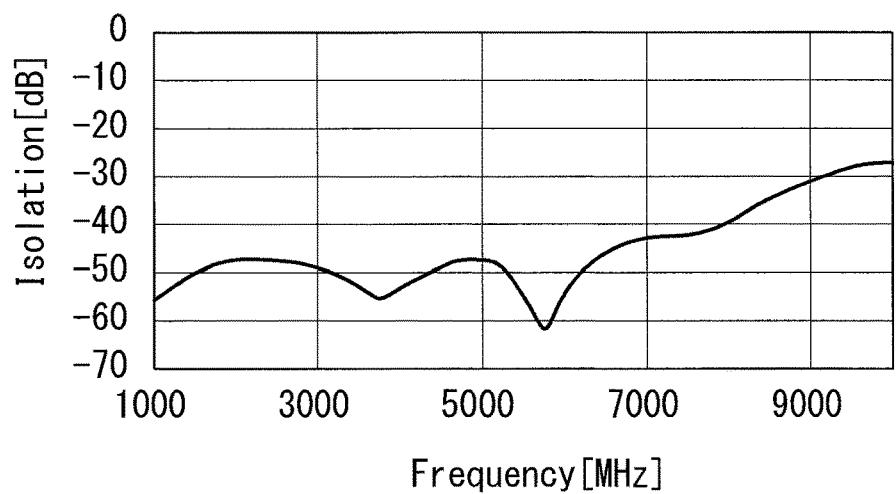
FIG. 13 is a characteristic diagram illustrating the frequency response of the isolation of the directional coupler according to the first embodiment of the invention.

FIG. 13 is a characteristic diagram illustrating the frequency response of the isolation of the directional coupler 1. In FIG. 13 the horizontal axis represents frequency, and the vertical axis represents isolation. If we let −i (dB) denote isolation, the value of i in the example of FIG. 13 is sufficiently large, i.e., 40 or above, in the frequency band of 1000 to 7000 MHz.

Figure 14:
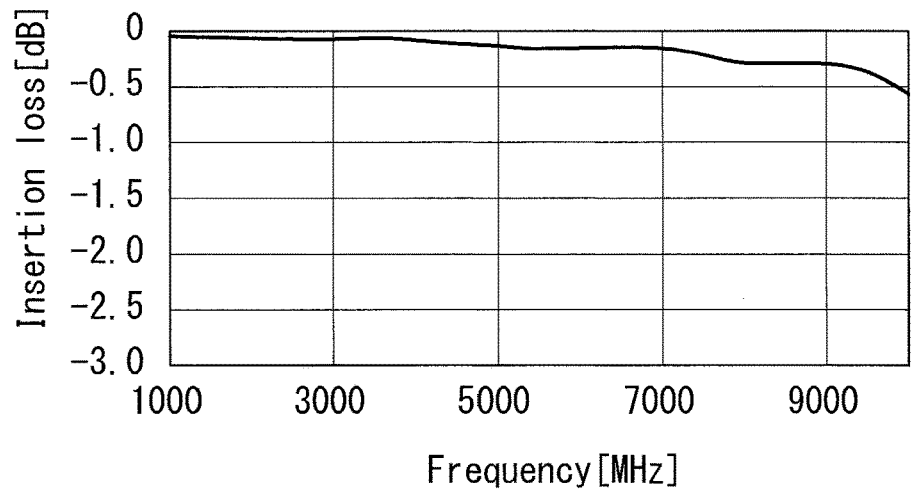
FIG. 14 is a characteristic diagram illustrating the frequency response of the insertion loss between a first port and a second port of the directional coupler according to the first embodiment of the invention.
Figure 15:
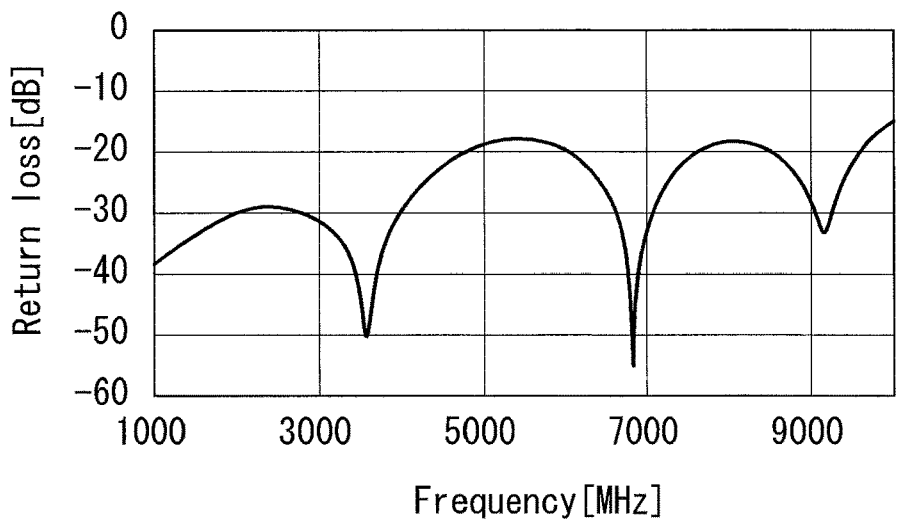
FIG. 15 is a characteristic diagram illustrating the frequency response of the return loss at the first port of the directional coupler according to the first embodiment of the invention.
Figure 16:
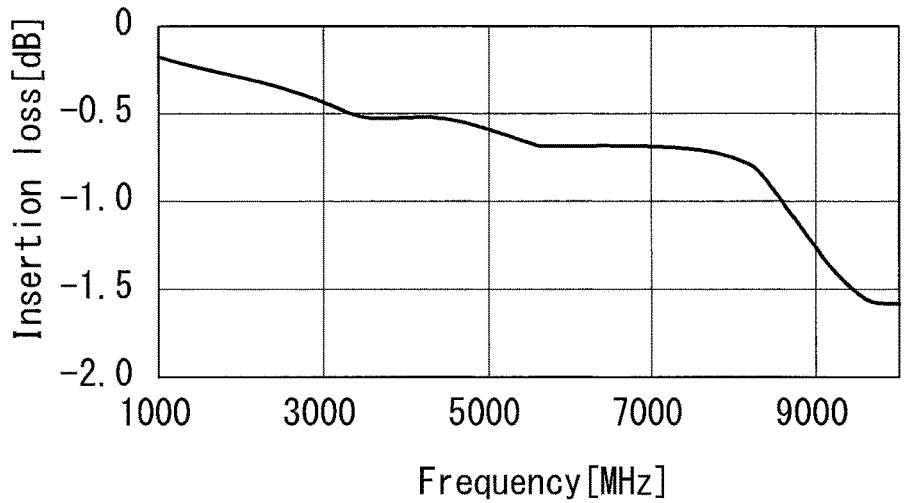
FIG. 16 is a characteristic diagram illustrating the frequency response of the insertion loss between a third port and a fourth port of the directional coupler according to the first embodiment of the invention.
Figure 17:
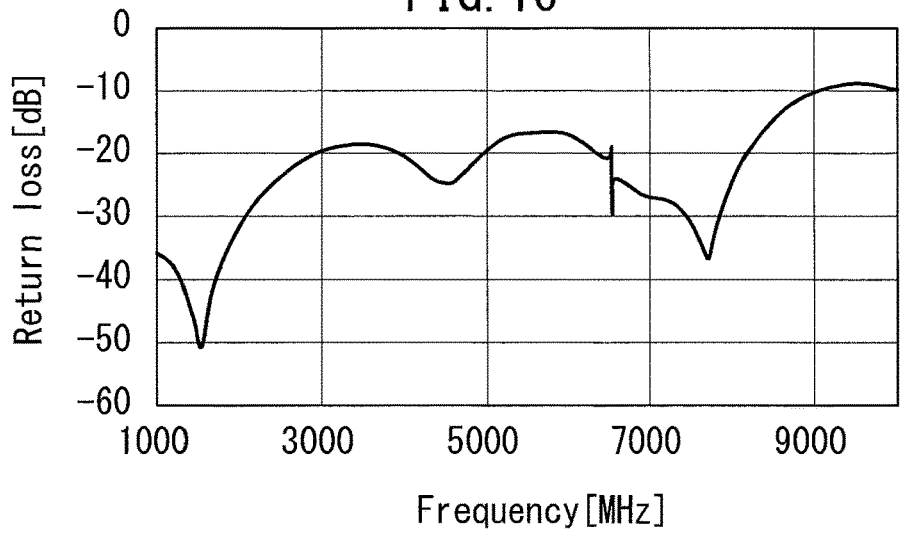
FIG. 17 is a characteristic diagram illustrating the frequency response of the return loss at the third port of the directional coupler according to the first embodiment of the invention.

FIG. 14 is a characteristic diagram illustrating the frequency response of the insertion loss between the first port 11 and the second port 12 in the directional coupler 1. In FIG. 14 the horizontal axis represents frequency, and the vertical axis represents insertion loss. FIG. 15 is a characteristic diagram illustrating the frequency response of the return loss at the first port 11 in the directional coupler 1. In FIG. 15 the horizontal axis represents frequency, and the vertical axis represents return loss. FIG. 16 is a characteristic diagram illustrating the frequency response of the insertion loss between the third port 13 and the fourth port 14 in the directional coupler 1. In FIG. 16 the horizontal axis represents frequency, and the vertical axis represents insertion loss. FIG. 17 is a characteristic diagram illustrating the frequency response of the return loss at the third port 13 in the directional coupler 1. In FIG. 17 the horizontal axis represents frequency, and the vertical axis represents return loss. The characteristics shown in FIG. 14 to FIG. 17 are all favorable ones in the frequency band of 1000 to 7000 MHz.

The directional coupler 1 having the characteristics shown in FIG. 12 to FIG. 17 is usable over a wide frequency band of at least 1000 to 7000 MHz.

Next, the characteristics of the directional coupler 1 according to the present embodiment will be compared with those of directional couplers of three comparative examples.

Figure 18:
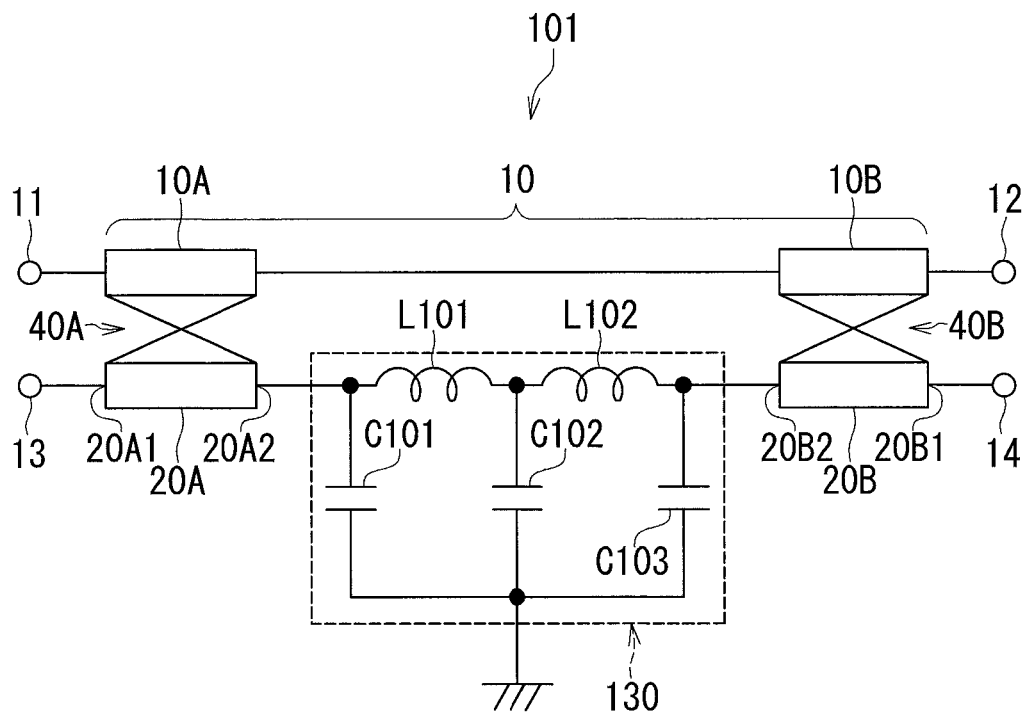
FIG. 18 is a circuit diagram illustrating the circuit configuration of a directional coupler of a first comparative example.

FIG. 18 shows a directional coupler 101 of a first comparative example. The directional coupler 101 of the first comparative example corresponds to the directional coupler described in U.S. Patent Application Publication No. 2012/0319797 A1. The directional coupler 101 of the first comparative example includes a delay section 130 in place of the phase shifter 30 of the directional coupler 1 according to the present embodiment. The delay section 130 is specifically a low-pass filter. The delay section 130 includes two inductors L101 and L102 and three capacitors C101, C102 and C103. Each of the inductors L101 and L102 has a first end and a second end opposite to each other. The first end of the inductor L101 is connected to the second end 20A2 of the first subline section 20A, and connected to the ground via the capacitor C101. The first end of the inductor L102 is connected to the second end 20B2 of the second subline section 20B, and connected to the ground via the capacitor C103. The second end of the inductor L101 and the second end of the inductor L102 are connected to each other, and connected to the ground via the capacitor C102.

Figure 19:
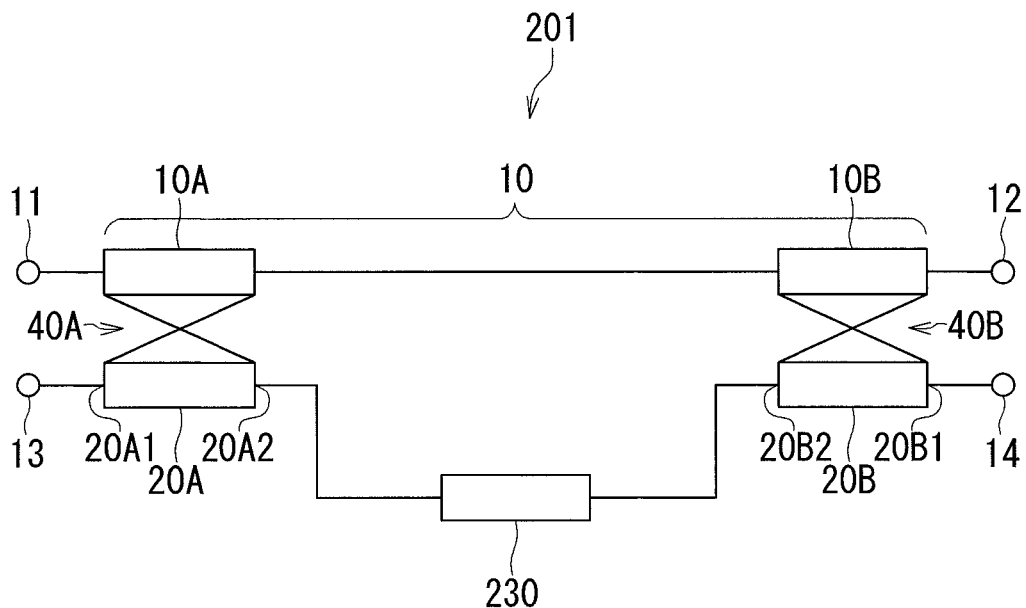
FIG. 19 is a circuit diagram illustrating the circuit configuration of a directional coupler of a second comparative example.

FIG. 19 shows a directional coupler 201 of a second comparative example. The directional coupler 201 of the second comparative example corresponds to the directional coupler described in JP 2013-214840A. The directional coupler 201 of the second comparative example includes a delay section 230 in place of the phase shifter 30 of the directional coupler 1 according to the present embodiment. The delay section 230 is specifically a delay line formed of a long line. The delay section 230 has a first end and a second end opposite to each other. The first end of the delay section 230 is connected to the second end 20A2 of the first subline section 20A. The second end of the delay section 230 is connected to the second end 20B2 of the second subline section 20B. The delay section 230 is not configured to be electromagnetically coupled to the main line 10.

Figure 20:
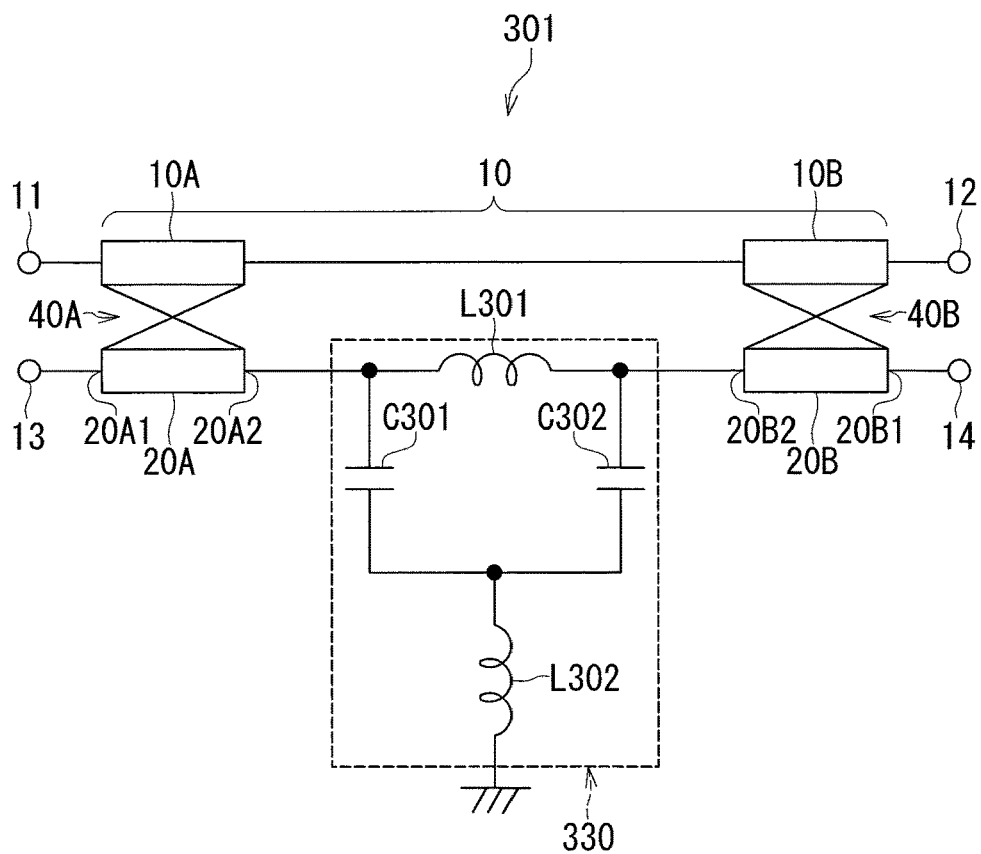
FIG. 20 is a circuit diagram illustrating the circuit configuration of a directional coupler of a third comparative example.

FIG. 20 shows a directional coupler 301 of a third comparative example. The directional coupler 301 of the third comparative example corresponds to the directional coupler described in U.S. Patent Application Publication No. 2015/0236666 A1. The directional coupler 301 of the third comparative example includes a delay section 330 in place of the phase shifter 30 of the directional coupler 1 according to the present embodiment. The delay section 330 is specifically a matching circuit. The delay section 330 includes two inductors L301 and L302 and two capacitors C301 and C302. Each of the inductors L301 and L302 has a first end and a second end opposite to each other. The first end of the inductor L301 is connected to the second end 20A2 of the first subline section 20A. The second end of the inductor L101 is connected to the second end 20B2 of the second subline section 20B. The capacitor C301 connects the first end of the inductor L301 and the first end of the inductor L302. The capacitor C302 connects the second end of the inductor L301 and the first end of the inductor L302. The second end of the inductor L302 is connected to the ground.

Figure 21:
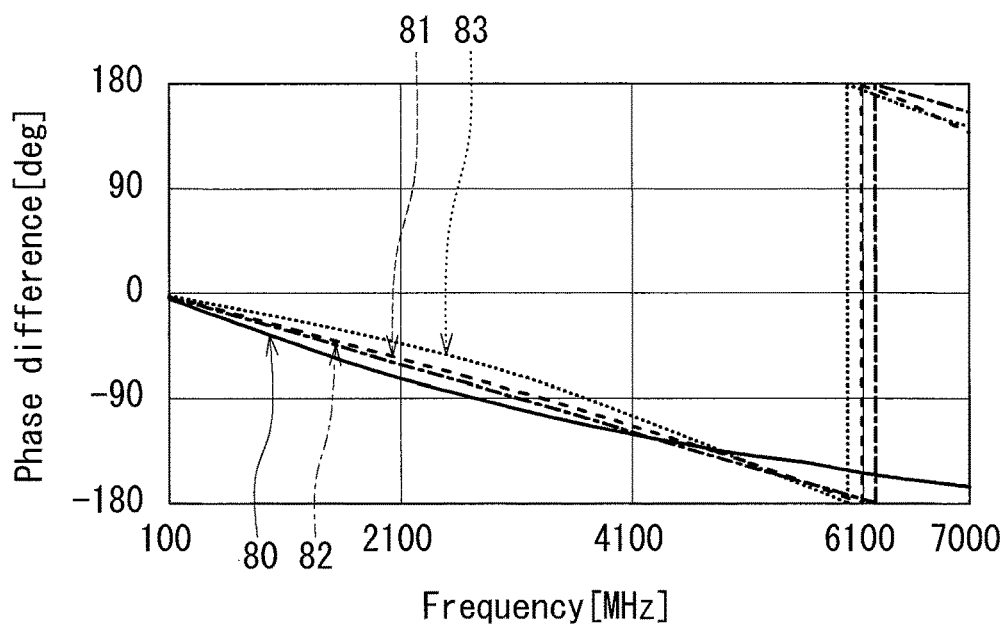
FIG. 21 is a characteristic diagram illustrating the characteristics of delay sections of the directional couplers of the first to third comparative examples and the phase shifter of the directional coupler according to the first embodiment of the invention.

FIG. 21 is a characteristic diagram illustrating the characteristics of the phase shifter 30 of the present embodiment and the delay sections 130, 230 and 330 of the first to third comparative examples. In FIG. 21 the horizontal axis represents frequency, and the vertical axis represents phase difference. As used therein, the phase difference refers to the difference in phase between an input signal and an output signal of each of the phase shifter 30 of the present embodiment and the delay sections 130, 230 and 330 of the first to third comparative examples. In FIG. 21, when the phase difference falls within the range of 0 degree to −180 degrees, the phase delay amount at each of the phase shifter 30 and the delay sections 130, 230 and 330 of the first to third comparative examples is the absolute value of the phase difference. In FIG. 21, when the phase difference falls within a range that is greater than 0 degree and smaller than or equal to 180 degrees, the phase delay amount at each of the phase shifter 30 and the delay sections 130, 230 and 330 of the first to third comparative examples is 360 degrees minus the phase difference.

In FIG. 21, the line 80 represents the frequency response of the phase difference at the phase shifter 30 of the present embodiment. The line 81 represents the frequency response of the phase difference at the delay section 130 of the first comparative example. The line 82 represents the frequency response of the phase difference at the delay section 230 of the second comparative example. The line 83 represents the frequency response of the phase difference at the delay section 330 of the third comparative example.

As shown in FIG. 21, the frequency response 82 of the phase difference at the delay section 230 of the second comparative example is represented by a straight line. The frequency response 81 of the phase difference at the delay section 130 of the first comparative example and the frequency response 83 of the phase difference at the delay section 330 of the third comparative example are each represented by a curve convex upward. The frequency response 80 of the phase difference at the phase shifter 30 of the present embodiment is represented by a curve convex downward.

Figure 22:
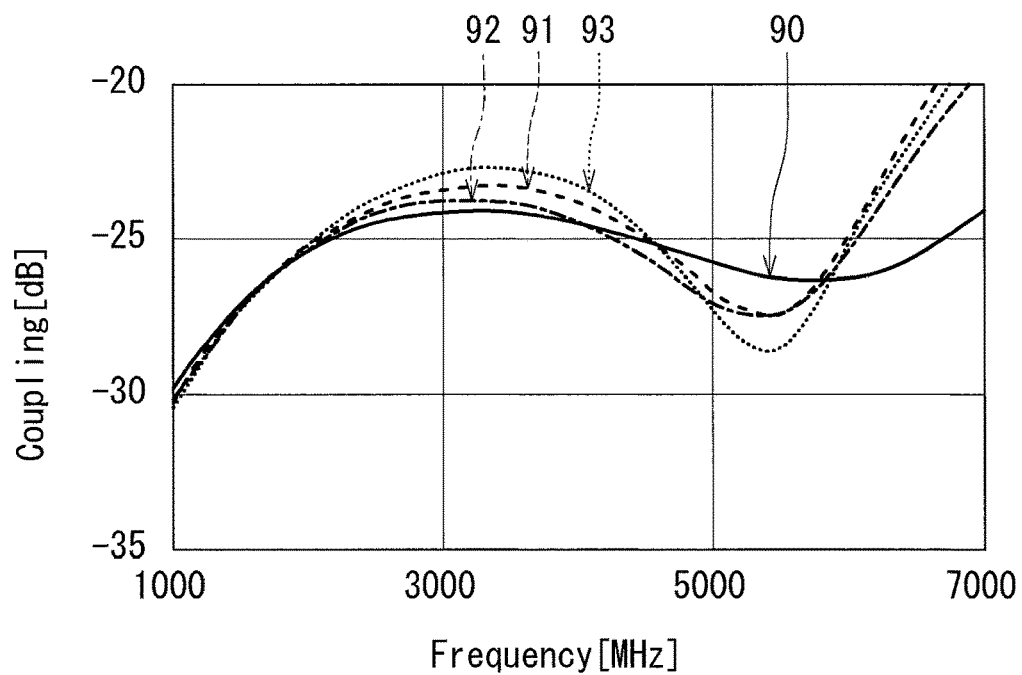
FIG. 22 is a characteristic diagram illustrating the frequency response of the coupling of each of the directional couplers of the first to third comparative examples and the directional coupler according to the first embodiment of the invention.

FIG. 22 is a characteristic diagram illustrating the frequency response of the coupling of each of the directional coupler 1 according to the present embodiment and the directional couplers 101, 201 and 301 of the first to third comparative examples. In FIG. 22, the horizontal axis represents frequency, and the vertical axis represents coupling.

In FIG. 22, the line 90 represents the frequency response of the coupling of the directional coupler 1 according to the present embodiment. The line 91 represents the frequency response of the coupling of the directional coupler 101 of the first comparative example. The line 92 represents the frequency response of the coupling of the directional coupler 201 of the second comparative example. The line 93 represents the frequency response of the coupling of the directional coupler 301 of the third comparative example.

FIG. 22 indicates that the directional coupler 1 according to the present embodiment achieves a smaller change in coupling in response to a change in frequency when compared with the directional couplers 101, 201 and 301 of the first to third comparative examples.

[Modification Examples]

Figure 23:
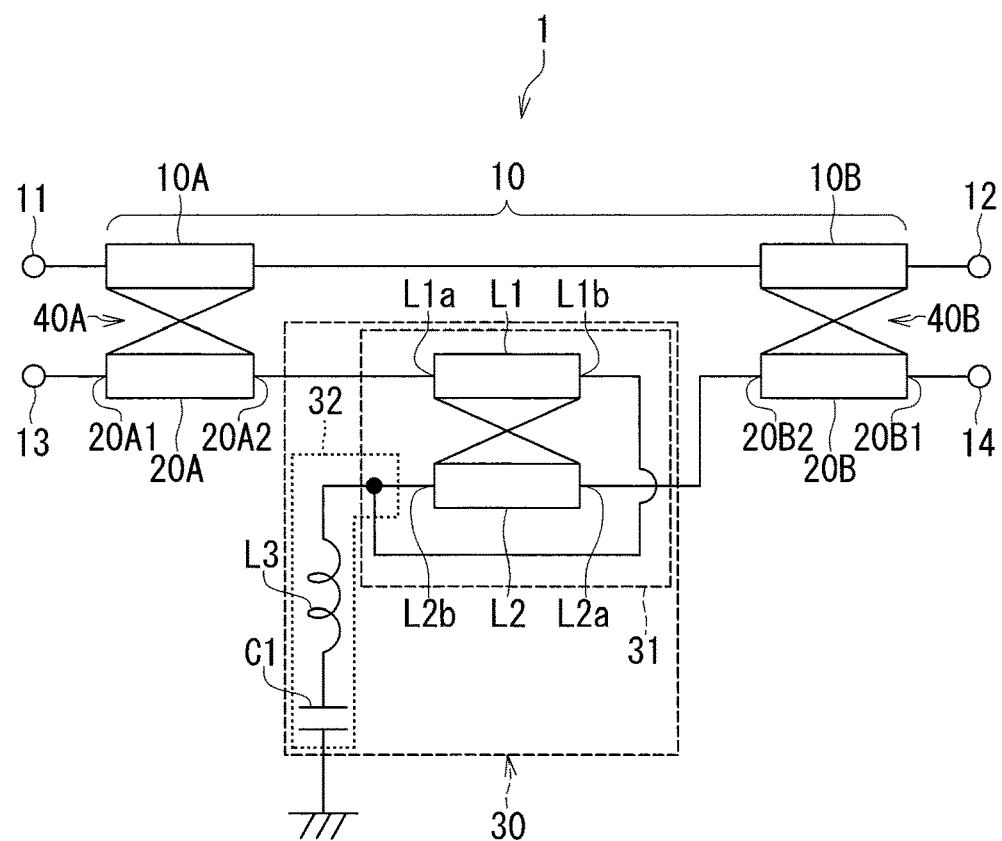
FIG. 23 is a circuit diagram illustrating the circuit configuration of a first modification example of the directional coupler according to the first embodiment of the invention.
Figure 24:
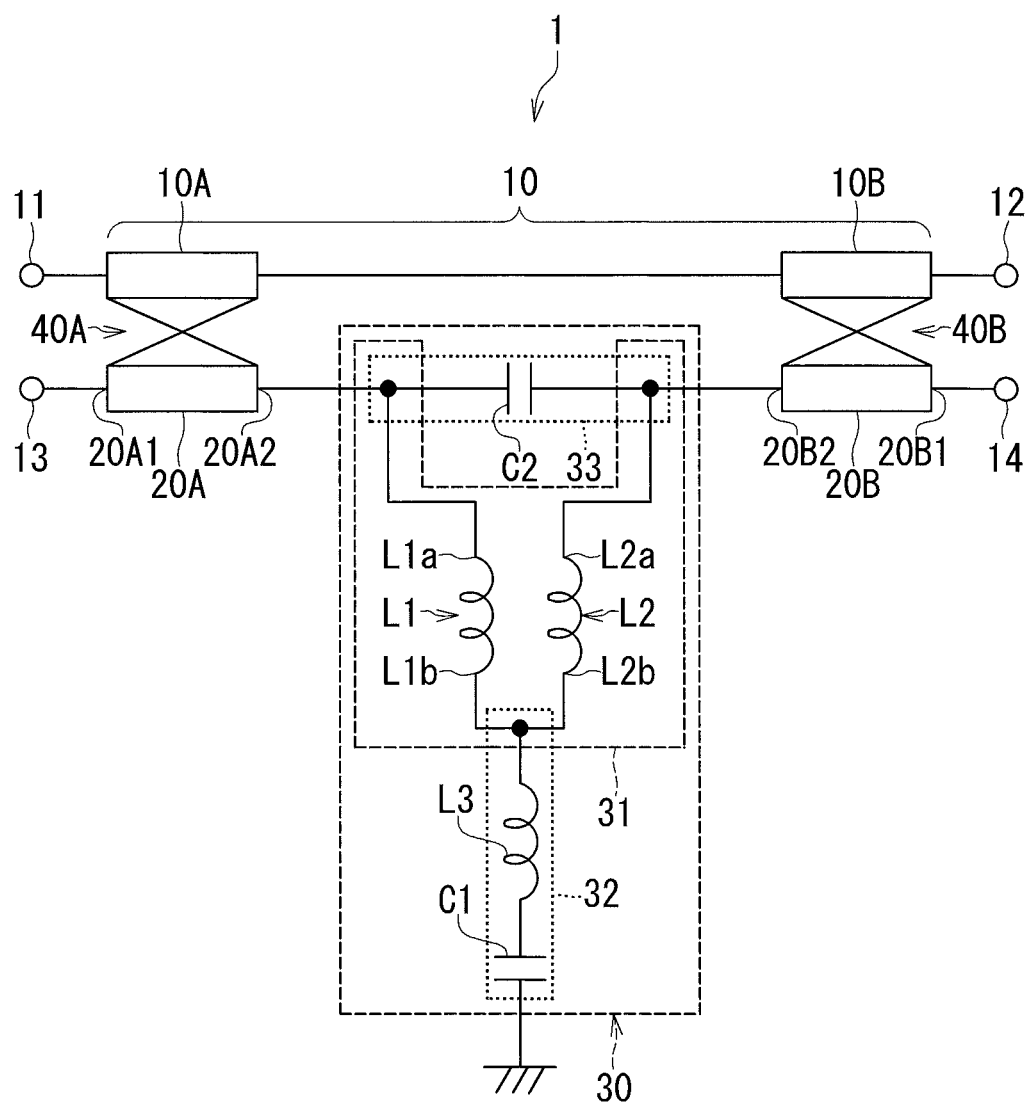
FIG. 24 is a circuit diagram illustrating the circuit configuration of a second modification example of the directional coupler according to the first embodiment of the invention.

Reference is now made to FIG. 23 and FIG. 24 to describe two modification examples of the directional coupler 1 according to the present embodiment. FIG. 23 shows the circuit configuration of a first modification example of the directional coupler 1. FIG. 24 shows the circuit configuration of a second modification example of the directional coupler 1. In the first and second modification examples, the second path 32 includes an inductor L3 connected in series to the first capacitor C1.

The first modification example shown in FIG. 23 modifies the first example of the circuit configuration of the directional coupler 1 shown in FIG. 1 to provide the inductor L3 between the first capacitor C1 and the connection point between the second end L1$b$ of the first inductance element L1 and the second end L2$b$ of the second inductance element L2.

The second modification example shown in FIG. 24 modifies the second example of the circuit configuration of the directional coupler 1 shown in FIG. 2 to provide the inductor L3 between the first capacitor C1 and the connection point between the second end L1$b$ of the first inductance element L1 and the second end L2$b$ of the second inductance element L2.

The inductor L3 has a function equivalent to reducing the coupling coefficient K of the inductive coupling between the first inductance element L1 and the second inductance element L2. The inductor L3 is thus provided for adjusting the characteristics of the phase shifter 30 as necessary.

[Second Embodiment]

Figure 25:
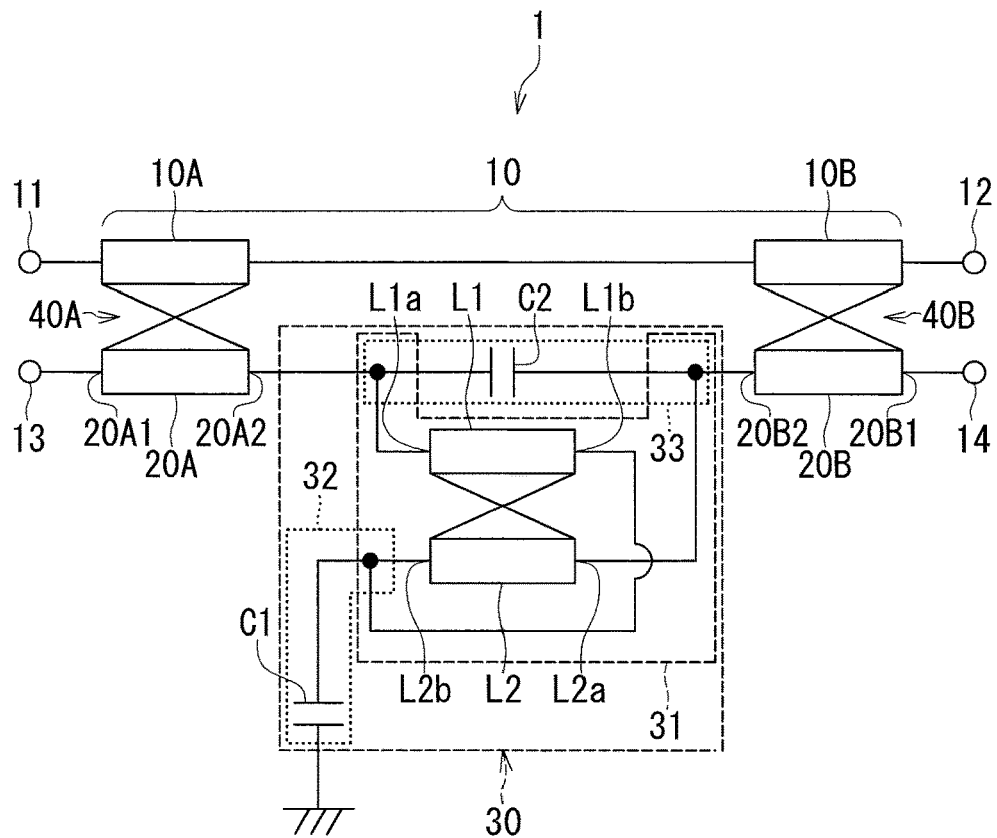
FIG. 25 is a circuit diagram illustrating the circuit configuration of a directional coupler according to a second embodiment of the invention.

A second embodiment of the invention will now be described. First, reference is made to FIG. 25 to describe the circuit configuration of a directional coupler according to the second embodiment. The directional coupler 1 according to the second embodiment is of the configuration in which the phase shifter 30 of the directional coupler 1 shown in FIG. 1 further includes a third path 33 connecting the first end L1$a$ of the first inductance element L1 and the first end L2$a$ of the second inductance element L2. The third path 33 includes a second capacitor C2 which is a lumped constant element. In the second embodiment, the first line (the first inductance element L1) and the second line (the second inductance element L2) may or may not be configured to be capacitively coupled to each other such that the capacitance between the first line and the second line is distributed continuously along the first and second liens.

Figure 26:
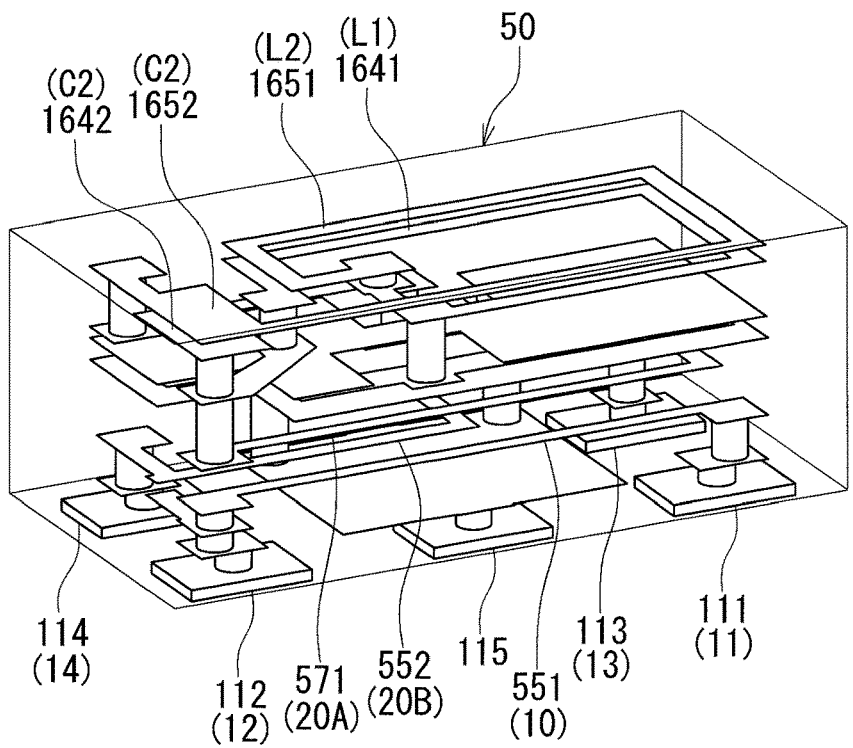
FIG. 26 is a perspective internal view of a stack included in the directional coupler according to the second embodiment of the invention.
Figure 27:
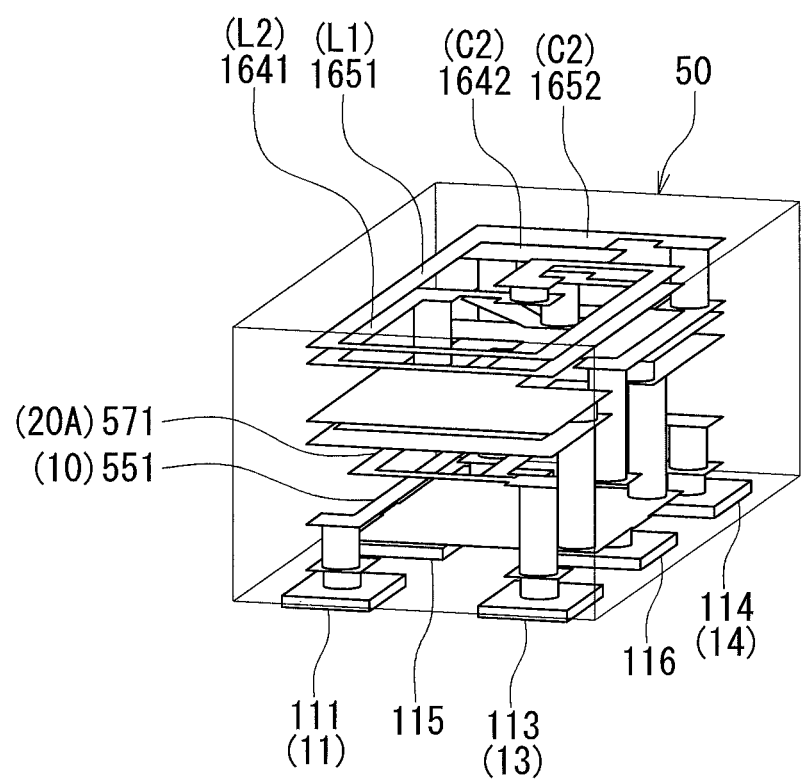
FIG. 27 is a perspective internal view of the stack included in the directional coupler according to the second embodiment of the invention

The stack 50 of the second embodiment will now be described in detail with reference to FIG. 26 to FIG. 28D. FIG. 26 and FIG. 27 are perspective internal views of the stack 50. The stack 50 of the second embodiment includes twelfth to fifteenth dielectric layers 162, 163, 164 and 165 in place of the twelfth to fifteenth dielectric layers 62, 63, 64 and 65 of the first embodiment, respectively. FIG. 28A to FIG. 28D illustrate the respective patterned surfaces of the twelfth to fifteenth dielectric layers 162 to 165.

Figure 28A:
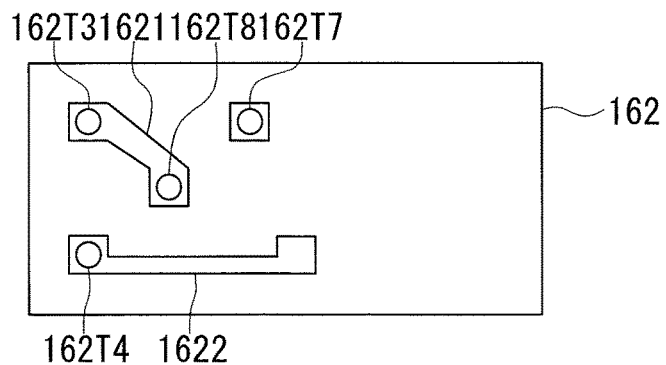
FIG. 28A to FIG. 28D are explanatory diagrams illustrating the respective patterned surfaces of twelfth to fifteenth dielectric layers of the stack included in the directional coupler according to the second embodiment of the invention.

As shown in FIG. 28A, conductor layers 1621 and 1622 are formed on the patterned surface of the twelfth dielectric layer 162. Each of the conductor layers 1621 and 1622 has a first end and a second end. Further, through holes 162T3, 162T4, 162T7 and 162T8 are formed in the dielectric layer 162. The through hole 162T3 is connected to a portion of the conductor layer 1621 near the first end thereof and to the through hole 61T3 shown in FIG. 8C. The through hole 162T4 is connected to a portion of the conductor layer 1622 near the first end thereof. The through hole 61T7 shown in FIG. 8C is connected to the through hole 162T7. The through hole 162T8 is connected to a portion of the conductor layer 1621 near the second end thereof. The through hole 61T4 shown in FIG. 8C is connected to a portion of the conductor layer 1622 near the second end thereof.

Figure 28B:
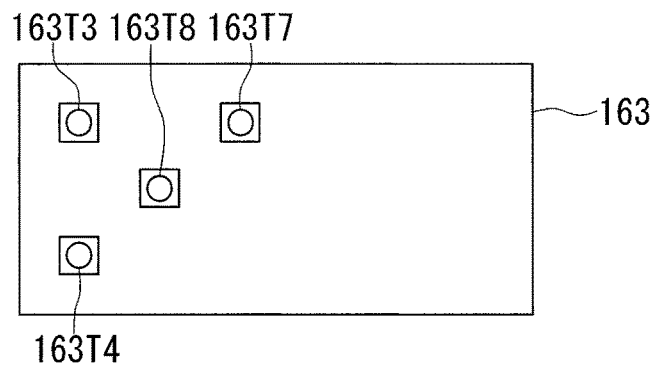

As shown in FIG. 28B, through holes 163T3, 163T4, 163T7 and 163T8 are formed in the thirteenth dielectric layer 163. The through holes 162T3, 162T4, 162T7 and 162T8 shown in FIG. 28A are connected to the through holes 163T3, 163T4, 163T7 and 163T8, respectively.

Figure 28C:
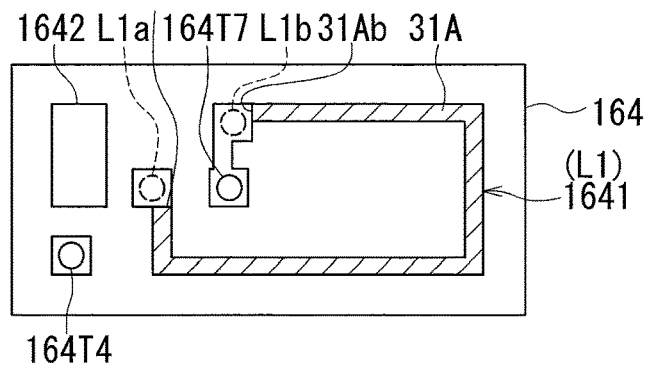

As shown in FIG. 28C, conductor layers 1641 and 1642 are formed on the patterned surface of the fourteenth dielectric layer 164. The conductor layer 1641 is used to form the first inductance element L1, and has a first end and a second end. The conductor layer 1642 is used to form the second capacitor C2. Further, through holes 164T4 and 164T7 are formed in the dielectric layer 164. The through hole 163T4 shown in FIG. 28B is connected to the through hole 164T4. The through hole 163T7 shown in FIG. 28B and the through hole 164T7 are connected to a portion of the conductor layer 1641 near the second end thereof. The through hole 163T3 shown in FIG. 28B is connected to the conductor layer 1642. The through hole 163T8 shown in FIG. 28B is connected to a portion of the conductor layer 1641 near the first end thereof.

Figure 28D:
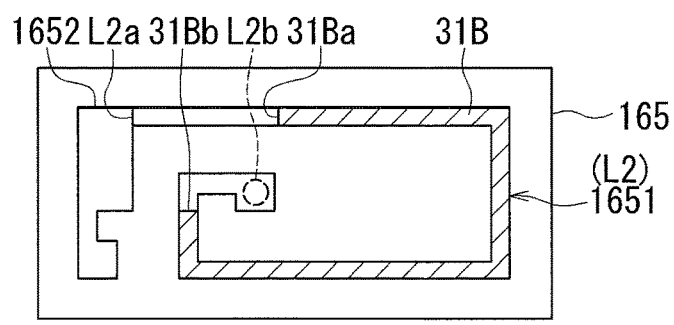

As shown in FIG. 28D, conductor layers 1651 and 1652 are formed on the patterned surface of the fifteenth dielectric layer 165. The conductor layer 1651 is used to form the second inductance element L2, and has a first end and a second end. The conductor layer 1652 is used to form the second capacitor C2, and is connected to the first end of the conductor layer 1651. The through hole 164T4 shown in FIG. 28C is connected to the conductor layer 1652. The through hole 164T7 shown in FIG. 28C is connected to a portion of the conductor layer 1651 near the second end thereof In the second embodiment, the first inductance element L1 is formed of the conductor layer 1641 shown in FIG. 28C. The second inductance element L2 is formed of the conductor layer 1651 shown in FIG. 28D. The portion of the conductor layer 1651 near the second end thereof is connected to the portion of the conductor layer 1641 near the second end thereof via the through hole 164T7. The portion of the conductor layer 1641 near the second end thereof is connected to the conductor layer 601 (see FIG. 8B), which is used to form the first capacitor C1, via the through holes 60T7 and 61T7 shown in FIG. 8B and FIG. 8C, and the through holes 162T7 and 163T7 shown in FIG. 28A and FIG. 28B.

The junction between the conductor layer 1641 and the through hole 163T8 corresponds to the first end L1a of the first inductance element L1. The junction between the conductor layer 1641 and the through hole 163T7 corresponds to the second end L1b of the first inductance element L1. The boundary between the conductor layers 1651 and 1652 corresponds to the first end L2a of the second inductance element L2. The junction between the conductor layer 1651 and the through hole 164T7 corresponds to the second end L2b of the second inductance element L2.

The second capacitor C2 is formed of the conductor layers 1642 and 1652 shown in FIG. 28C and FIG. 28D, and the dielectric layer 164 interposed between the conductor layers 1642 and 1652. The conductor layer 1652 is connected to the conductor layer 1651 used to form the second inductance element L2. The conductor layer 1652 is connected to the conductor layer 552 (see FIG. 7A), which is used to form the second subline section 20B, via the through holes 55T4, 56T4, 57T4, 58T4, 59T4, 60T4 and 61T4 shown in FIG. 7A to FIG. 8C, the conductor layer 1622 shown in FIG. 28A, and the through holes 162T4, 163T4 and 164T4 shown in FIG. 28A to FIG. 28C.

The portion of the conductor layer 1641 near the first end thereof is connected to the conductor layer 1621 shown in FIG. 28A via the through holes 162T8 and 163T8 shown in FIG. 28A and FIG. 28B, the conductor layer 1641 being used to form the first inductance element L1. The conductor layer 1642, which is used to form the second capacitor C2, is connected to the conductor layer 1621 via the through holes 162T3 and 163T3 shown in FIG. 28A and FIG. 28B. The conductor layer 1621 is connected to the conductor layer 571 (see FIG. 7C), which is used to form the first subline section 20A, via the through holes 57T3, 58T3, 59T3, 60T3 and 61T3 shown in FIG. 7C to FIG. 8C.

The structural features of the directional coupler 1 including the stack 50 will now be described. In the stack 50, the conductor layer 1641 used to form the first inductance element L1, the conductor layer 1651 used to form the second inductance element L2, the conductor layers 591, 601, 611 and dielectric layers 59, 60 (see FIG. 8A to FIG. 8C) used to form the first capacitor C1, and the conductor layers 1642, 1652 and dielectric layer 164 used to form the second capacitor C2 are located closer to the top surface 50A (see FIG. 3) than are the conductor layer 551 (see FIG. 7A) used to form the main line 10, the conductor layer 571 (see FIG. 7C) used to form the first subline section 20A, and the conductor layer 552 (see FIG. 7A) used to form the second subline section 20B. Thus, the phase shifter 30 is located closer to the top surface 50A than are the main line 10 and the first and second subline sections 20A and 20B.

The conductor layer 1641 used to form the first inductance element L1 and the conductor layer 1651 used to form the second inductance element L2 are located closer to the top surface 50A than are the conductor layers 591, 601, 611 and dielectric layers 59, 60 used to form the first capacitor C1.

The ground conductor layer 591 (see FIG. 8A) is interposed between the conductor layer 551, which is used to form the main line 10, and the conductor layers 641, 651. Thus, neither of the first and second inductance elements L1 and L2 is configured to be electromagnetically coupled to the main line 10.

As previously mentioned, in the directional coupler 1 according to the second embodiment, the first inductance element L1 and the second inductance element L2 are the first line and the second line, respectively. The first line is formed of the conductor layer 1641 shown in FIG. 28C. The second line is formed of the conductor layer 1651 shown in FIG. 28D.

The first line includes a first line portion 31A. In FIG. 28C the first line portion 31A is shown with hatching. The first line portion 31A has a first edge 31Aa and a second edge 31Ab opposite to each other, the first edge 31Aa being closest to the first subline section 20A in terms of circuit configuration. The first edge 31Aa is located near the first end L1a of the first inductance element L1. The second edge 31Ab is located near the second end L1b of the first inductance element L1.

The second line includes a second line portion 31B opposed to the first line portion 31A. In FIG. 28D the second line portion 31B is shown with hatching. The second line portion 31B has a first edge 31Ba and a second edge 31Bb opposite to each other, the first edge 31Ba being closest to the second subline section 20B in terms of circuit configuration. The first edge 31Ba is located near the first end L2a of the second inductance element L2. The second edge 31Bb is located near the second end L2b of the second inductance element L2.

As shown in FIG. 28C and FIG. 28D, the first edge 31Ba of the second line portion 31B is physically closer to the second edge 31Ab of the first line portion 31A than to any other part of the first line portion 31A. The second edge 31Bb of the second line portion 31B is physically closer to the first edge 31Aa of the first line portion 31A than to any other part of the first line portion 31A.

The directional coupler 1 according to the second embodiment includes the third path 33 including the second capacitor C2. Thus, in the second embodiment, such a capacitive coupling between the first line (the first inductance element L1) and the second line (the second inductance element L2) that the capacitance between the first line and the second line is distributed continuously along the first and second lines may be weakly established or may be absent.

[Modification Example]

Figure 29:
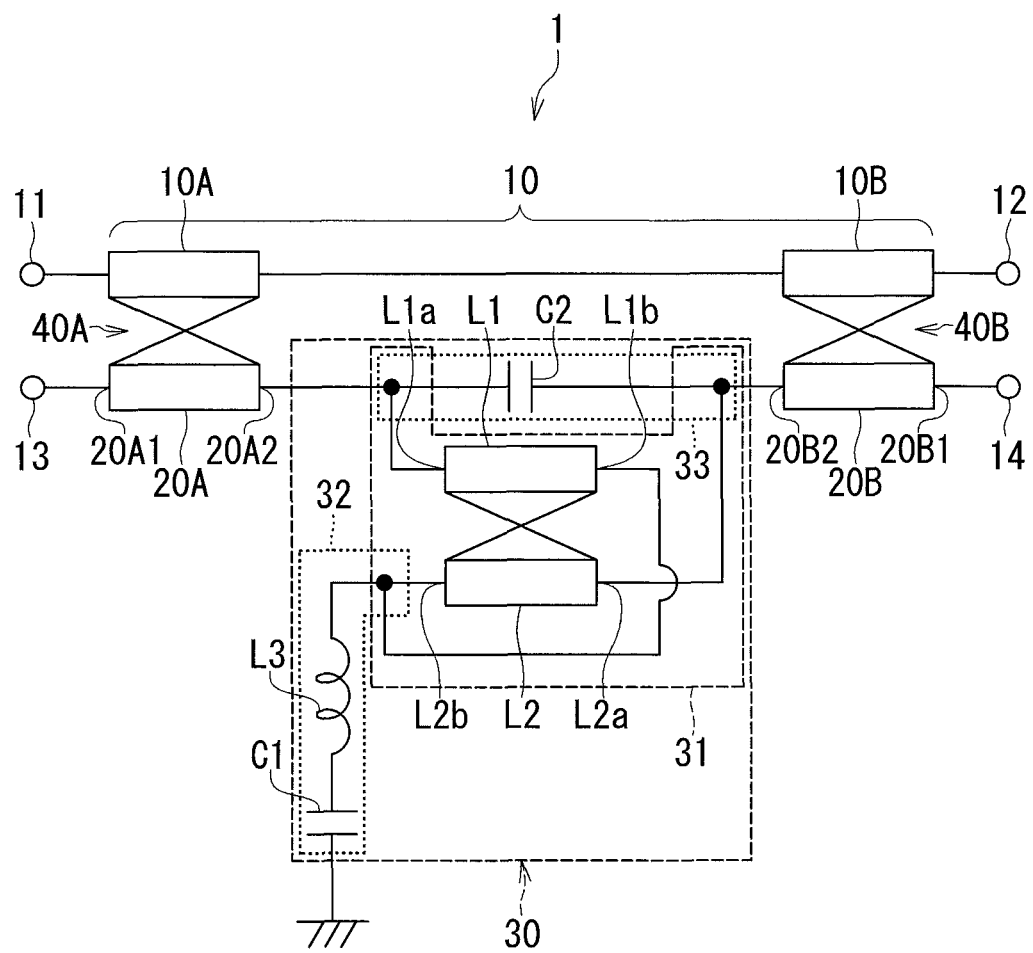
FIG. 29 is a circuit diagram illustrating the circuit configuration of a modification example of the directional coupler according to the second embodiment of the invention.

A modification example of the directional coupler 1 according to the second embodiment will now be described with reference to FIG. 29. In this modification example, the second path 32 includes the inductor L3 connected in series to the first capacitor C1. The inductor L3 is provided between the first capacitor C1 and the connection point between the second end L1b of the first inductance element L1 and the second end L2b of the second inductance element L2. The function of the inductor L3 is as has been described in relation to the first embodiment.

The remainder of configuration, operation and effects of the second embodiment are similar to those of the first embodiment.

The present invention is not limited to the foregoing embodiments, and various modifications may be made thereto. For example, in the directional coupler of the present invention, not only the first and second subline sections and the phase shifter but also at least one set of an additional subline section and phase shifter may be provided between the third port and the fourth port. In such a case, in terms of circuit configuration, the three or more subline sections and the two or more phase shifters are provided between the third port and the fourth port in such a manner that the subline sections alternate with the phase shifters.

Obviously, many modifications and variations of the present invention are possible in the light of the above teachings. Thus, it is to be understood that, within the scope of the appended claims and equivalents thereof, the invention may be practiced in other than the foregoing most preferable embodiments.

What is claimed is:

1. A directional coupler comprising:
    a first port;
    a second port;
    a third port;
    a fourth port;
    a main line connecting the first port and the second port;
    a first subline section and a second subline section each formed of a line configured to be electromagnetically coupled to the main line; and
    a phase shifter for outputting a signal that is phase-delayed relative to an input signal, wherein
    the first subline section, the phase shifter, and the second subline section are arranged in this order in series between the third port and the fourth port in terms of circuit configuration,
    a phase delay amount of the output signal of the phase shifter relative to the input signal of the phase shifter increases with increasing frequency of the input signal, and
    a frequency twice as high as a frequency of the input signal at which the phase delay amount is 90 degrees is lower than a frequency of the input signal at which the phase delay amount is 180 degrees.

2. The directional coupler according to claim 1, further comprising a stack for integrating the first to fourth ports, the main line, the first and second subline sections and the phase shifter, the stack including dielectric layers and conductor layers stacked on each other.

3. The directional coupler according to claim 2, wherein the stack has a top surface and a bottom surface located at opposite ends in a direction in which the dielectric layers and the conductor layers are stacked, and the phase shifter is located closer to the top surface than are the main line and the first and second subline sections.

4. A directional coupler comprising: a first port; a second port; a third port; a fourth port; a main line connecting the first port and the second port; a first subline section and a second subline section each formed of a line configured to be electromagnetically coupled to the main line; and a phase shifter for outputting a signal that is phase-delayed relative to an input signal, wherein the first subline section, the phase shifter, and the second subline section are arranged in this order in series between the third port and the fourth port in terms of circuit configuration, the phase shifter includes a first path and a second path, the first path connecting the first subline section and the second subline section, the first path includes a first inductance element and a second inductance element having their respective inductances and configured to be inductively coupled to each other, each of the first and second inductance elements has a first end and a second end opposite to each other, the first end of the first inductance element is connected to the first subline section, the first end of the second inductance element is connected to the second subline section, the second end of the first inductance element and the second end of the second inductance element are connected to each other, and connected to a ground via the second path, and the second path includes a first capacitor.

5. The directional coupler according to claim 4, wherein the first inductance element is a first line, and the second inductance element is a second line.

6. The directional coupler according to claim 5, wherein the first line and the second line are configured to be capacitively coupled to each other.

7. The directional coupler according to claim 5, wherein the first line includes a first line portion,
    the second line includes a second line portion opposed to the first line portion, the first line portion has a first edge and a second edge opposite to each other, the first edge of the first line portion being closest to the first subline section in terms of circuit configuration, the second line portion has a first edge and a second edge opposite to each other, the first edge of the second line portion being closest to the second subline section in terms of circuit configuration, and the first edge of the second line portion is physically closer to the second edge of the first line portion than to any other part of the first line portion, and the second edge of the second line portion is physically closer to the first edge of the first line portion than to any other part of the first line portion.

8. The directional coupler according to claim 4, wherein the phase shifter further includes a third path connecting the first end of the first inductance element and the first end of the second inductance element, and the third path includes a second capacitor.

9. The directional coupler according to claim 4, wherein the second path further includes an inductor connected in series to the first capacitor.

10. The directional coupler according to claim 4, further comprising a stack for integrating the first to fourth ports, the main line, the first and second subline sections and the phase shifter, the stack including dielectric layers and conductor layers stacked on each other.

11. The directional coupler according to claim 10, wherein the stack has a top surface and a bottom surface located at opposite ends in a direction in which the dielectric layers and the conductor layers are stacked, and the phase shifter is located closer to the top surface than are the main line and the first and second subline sections.

* * * * *